US007804338B2

(12) United States Patent
Nagumo

(10) Patent No.: US 7,804,338 B2
(45) Date of Patent: Sep. 28, 2010

(54) DRIVE CIRCUIT, LIGHT EMITTING DIODE HEAD, AND IMAGE FORMING APPARATUS

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 310 days.

(21) Appl. No.: 12/153,654

(22) Filed: May 22, 2008

(65) Prior Publication Data

US 2008/0292344 A1 Nov. 27, 2008

(30) Foreign Application Priority Data

May 22, 2007 (JP) ............................ 2007-135891

(51) Int. Cl.
*H03K 3/00* (2006.01)

(52) U.S. Cl. ...................................................... 327/108

(58) Field of Classification Search ................. 327/108, 327/109; 347/237

See application file for complete search history.

(56) References Cited

U.S. PATENT DOCUMENTS 5,467,036 A * 11/1995 Sawada ...................... 327/108
6,194,960 B1 * 2/2001 Nagumo ..................... 327/565

FOREIGN PATENT DOCUMENTS

JP 09-109459 4/1997
JP 2000-335004 5/2000

* cited by examiner

*Primary Examiner*—Hai L Nguyen
(74) *Attorney, Agent, or Firm*—Kubotera & Associates LLC

(57) ABSTRACT

A drive circuit includes a drive element for driving a driven element; a correction data input section for adjusting a drive current of the driven element; a resistor having an end portion connected to ground; and a control voltage generation section for generating a direction value of the drive current. The control voltage generation section includes a calculation amplifier having a first input terminal for receiving a standard voltage, a second input terminal, and an output terminal; a first conductive type transistor having a first terminal, a second terminal connected to the ground, and a control terminal connected to the output terminal; and a current-mirror circuit including a control side transistor and a follower side transistor. The control side transistor has a current output terminal connected to the first terminal. The follower side transistor has a current output terminal connected to another end portion of the resistor and the second input terminal.

14 Claims, 26 Drawing Sheets

| Correction data | | | | Correction value | |
|---|---|---|---|---|---|
| S3 | S2 | S1 | S0 | | |
| 1 | 1 | 1 | 1 | +24 % | Increase light amount ⇧ |
| 1 | 1 | 1 | 0 | +21 % | |
| 1 | 1 | 0 | 1 | +18 % | |
| 1 | 1 | 0 | 0 | +15 % | |
| 1 | 0 | 1 | 1 | +12 % | |
| 1 | 0 | 1 | 0 | +9 % | |
| 1 | 0 | 0 | 1 | +6 % | |
| 1 | 0 | 0 | 0 | +3 % | |
| 0 | 1 | 1 | 1 | ±0 % | Correction center |
| 0 | 1 | 1 | 0 | -3 % | ⇩ Decrease light amount |
| 0 | 1 | 0 | 1 | -6 % | |
| 0 | 1 | 0 | 0 | -9 % | |
| 0 | 0 | 1 | 1 | -12 % | |
| 0 | 0 | 1 | 0 | -15 % | |
| 0 | 0 | 0 | 1 | -18 % | |
| 0 | 0 | 0 | 0 | -21 % | |

FIG. 20
CONVENTIONAL ART

DRIVE CIRCUIT, LIGHT EMITTING DIODE HEAD, AND IMAGE FORMING APPARATUS

BACKGROUND OF THE INVENTION AND RELATED ART STATEMENT

The present invention relates to a drive circuit for driving a group of driven elements such as, for example, an array of light emitting diodes (LEDs) disposed in an electro-photography printer as a light source, an array of heating resistors disposed in a thermal printer, and an array of display units disposed in a display device. The present invention also relates to a light emitting diode (LED) head including the drive circuit; and an image forming apparatus including the light emitting diode (LED) head.

In the specification, a light emitting diode may be referred to as an LED; a monolithic integrated circuit may be referred to as an IC; an n-channel MOS (Metal Oxide Semiconductor) transistor may be referred to as an NMOS (transistor); and a p-channel MOS transistor may be referred to as a PMOS (transistor).

Further, a high signal level may be referred to as a logical value of one (1), and a low signal level may be referred to as a logical value of zero (0), regardless of a positive logic or a negative logic. When it is necessary to differentiate the positive logic and the negative logic in a logical signal, "-P" may be added to an end of a positive logical signal, and "-n" may be added to an end of a negative logical signal.

In the following description, a group of driven elements is an array of LEDs used in an electro-photography printer as an example.

In a conventional electro-photography printer, LEDs selectively irradiate a photosensitive drum charged according to print information, thereby forming a static latent image on the photosensitive drum. Then, toner is attached to the static latent image to form a toner image. Afterward, the toner image is transferred to a sheet, so that the toner image is fixed to the sheet.

Patent Reference 1 has disclosed such a conventional electro-photography printer. In the conventional electro-photography printer, LED drive control is performed in the following manner.

Patent Reference 1: Japanese Patent Publication No. 09-109459

FIG. 16 is a block diagram showing a printer control circuit of the conventional electro-photography printer. As shown in FIG. 16, the printer control circuit includes a print control unit 1 formed of a microprocessor; an ROM; an RAM; an input/output port; a timer; and the likes.

The print control unit 1 is disposed inside a printing unit of the conventional electro-photography printer. The print control unit 1 receives a control signal SG1, and a video signal SG2 (in which dot map data are arranged in one-dimensional pattern) from a host controller (not shown), so that the print control unit 1 controls the conventional electro-photography printer as a whole through sequence control, thereby performing a printing operation.

When the print control unit 1 receives a print direction through the control signal SG1, the print control unit 1 first determines with a fixing device temperature sensor 23 whether a fixing device 22 with a heater 22*a* disposed therein reaches a usable temperature. When it is determined that the fixing device 22 is not within the usable temperature, the print control unit 1 supplies power to the heater 22*a*, so that the fixing device 22 is heated to the usable temperature.

In the next step, the print control unit 1 controls a development-transfer process motor (PM) 3 to rotate through a driver 2. At the same time, the print control unit 1 controls a charge voltage power source 25 to turn on, thereby charging a developing device 27. When a sheet remaining amount sensor 8 and a sheet size sensor 9 confirm a presence and a type of a sheet, the print control unit 1 starts transporting the sheet according to the type of the sheet.

A sheet transportation motor (PM) 5 is connected to a planetary gear, so that the sheet transportation motor (PM) 5 is capable of rotating both directions through a driver 4. Accordingly, it is possible to change a rotational direction of the sheet transportation motor (PM) 5, so that different sheet transportation rollers disposed inside the printer can be driven selectively.

Each time when the printing operation starts for printing on one sheet, the sheet transportation motor (PM) 5 rotates in a reverse direction first, so that the sheet is transported until a sheet inlet sensor 6 detects the sheet. Afterward, the sheet transportation motor (PM) 5 rotates in a forward direction, so that the sheet is transported to the printing unit disposed inside the printer.

When the sheet reaches a printable position, the print control unit 1 sends a timing signal SG3 (including a main scanning synchronization signal and a sub scanning synchronization signal) to the host controller, and receives the video signal SG2. The host controller edits the video signal SG2 per page, and returns the video signal SG2 to the print control unit 1.

When the print control unit 1 receives the video signal SG2 from the host controller, the print control unit 1 sends the video signal SG2 to an LED head 19 as a print data signal HD-DATA. In the LED head 19, a plurality of LEDs is arranged linearly each for printing one dot (pixel).

When the print control unit 1 receives the video signal SG2 for one line, the print control unit 1 sends a latch signal HD-LOAD to the LED head 19, so that the print data signal HD-DATA is retained in the LED head 19. The print control unit 1 is capable of printing the print data signal HD-DATA retained in the LED head 19 while the print control unit 1 is receiving a next video signal SG2 from the host controller. Note that the LED head 19 receives a clock signal HD-CLK, so that the print control unit 1 can send the print data signal HD-DATA to the LED head 19.

The video signal SG2 is sent and received per a print line. A photosensitive drum (not shown) is charged with a negative potential, and the LED head 19 irradiates the photosensitive drum. Accordingly, information to be printed becomes a latent image on the photosensitive drum as dots with an increased potential. Then, in a developing device 27, toner for forming an image is charged with a negative potential, so that toner is attracted to each dot through a strong attractive force, thereby forming a toner image.

In the next step, the toner image is transported to a transfer device 28. At this time, a transfer high voltage power source 26 is turned on to have a positive potential through a transfer signal SG4. Accordingly, the transfer device 28 transfers the toner image to the sheet passing through between the photosensitive drum and the transfer device 28.

After the toner image is transferred to the sheet, the sheet is transported and abuts against the fixing device 22 with the heater 22*a* disposed therein. Accordingly, the fixing device 22 fixes the toner image to the sheet through heat. After the image is fixed to the sheet, the sheet is transported further, and is discharged from the printing unit of the printer to outside the printer through a sheet discharge outlet sensor 7.

When the sheet size sensor 9 and the sheet inlet sensor 6 detects the sheet, the print control unit 1 applies a voltage from the transfer high voltage power source 26 to the transfer device 28 only while the sheet is passing through the transfer device 28. After the printing operation is completed, and the sheet passes through the sheet discharge outlet sensor 7, the print control unit 1 stops applying a voltage from the charge voltage power source 25 to the developing device 27. At the same time, the print control unit 1 stops the development-transfer process motor (PM) 3. Afterward, the operation described above is repeated.

A configuration of the LED head 19 will be explained next. FIG. 17 is a block diagram showing the configuration of the LED head 19 of the conventional electro-photography printer.

The LED head 19 shown in FIG. 17 has a resolution of 600 dots, and is capable of printing an A-4 size sheet. In this case, a total number of LED elements is 4992 dots. More specifically, 26 of LED arrays are arranged, and each of the LED arrays includes 192 of LED elements. Cathode terminals of the LED elements in each of the LED arrays are commonly connected to a ground terminal.

In the LED head 19 shown in FIG. 17, the cathode terminals of the LED elements in each of the LED arrays are commonly connected to the ground terminal. Alternatively, there has been known a configuration, in which anode terminals of the LED elements in each of the LED arrays may be commonly connected to a ground terminal. In this case, the LED elements in each of the LED arrays have individual cathode terminals.

As shown in FIG. 17, the LED head 19 includes LED arrays CHP1 to CHP26 (note that CHP3 to CHP24 are omitted in FIG. 17); and driver ICs IC1 to IC26 (note that IC3 to IC24 are omitted in FIG. 17) for driving the LED arrays CHP1 to CHP26, respectively. The driver ICs IC1 to IC26 have an identical circuit, and are connected to an adjacent driver IC in a cascade arrangement.

The LED array 1 includes LED elements LED1 to LED192, and each of the LED array includes 192 LED elements. Accordingly, LED elements LED4609 to LED 4800 belong to the LED array CHP25, and LED elements LED4801 to LED 4992 belong to the LED array CHP26.

As described above, in the LED head 19 shown in FIG. 17, 26 of the LED arrays CHP1 to CHP26 and 26 of the driver ICs IC1 to IC26 are arranged in line to face each other on a print circuit board (not shown). Accordingly, it is possible to drive 192 of the LED elements per one chip of the driver IC.

Further, 26 of chips of the driver ICs are connected in the cascade arrangement, so that print data input externally can be transmitted in serial. In the LED head 19 shown in FIG. 17, four of data lines are provided, so that data for four pixels arranged adjacently can be transmitted with one pulse of the clock signal.

The LED arrays CHP1 to CHP26 shown in FIG. 17 may be formed of a semiconductor compound such as GaAsP, AlGaAs, and the likes. In manufacturing the LED arrays CHP1 to CHP26, it is difficult to eliminate a variance in a property due to a lattice defect in a crystal and the likes. Accordingly, when the light emitting element is produced, a variance in a light amount may occur in each of the LED array chips or each of the LED elements. When the light emitting element with a variance in a light amount is used in an LED printer as is, a variance in a printed text may occur, thereby causing poor printing quality.

To this end, in the LED head, a drive current is adjusted per each of the LED array chips or each of the LED elements in order to correct the variance in the light amount of the LED arrays. A specific configuration for correcting the light amount will be described later.

As shown in FIG. 17, the driver ICs IC1 to IC26 are formed of an identical circuit, and are connected to an adjacent driver IC in the cascade arrangement. Each of the driver ICs IC1 to IC26 includes a shift register circuit (described later) formed of a 48-stage flip-flop circuit. Accordingly, it is possible to shift-input print data HD-DATA3~0 synchronized with a clock signal HD-CLK, and to transmit print data for 192 dots with a 48 pulse clock input.

Each of the driver ICs IC1 to IC26 includes a shift register circuit 44 for receiving the clock signal HD-CLK and shift-transmitting the print data; a latch circuit 43 for latching an output signal of the shift resister circuit 44 with a latch signal HD-LOAD; a logic product circuit or an AND circuit 42 for receiving output signals of the latch circuit 43 and an inverter circuit 41 to obtain a logic product; an LED drive section 40 for supplying a drive current from a power source VDD to the LED element according to an output signal of the AND circuit 42; and a control voltage generation circuit 45 for generating a direction voltage to the LED drive section 40 to maintain the drive current constant.

In the LED head 19 shown in FIG. 17, a strobe signal HD-STB-N is input to the inverter circuits 41. A standard voltage generation circuit 46 is connected to the power source VDD, and a ground terminal thereof is connected to a ground of the LED head 19. The standard voltage generation circuit 46 outputs a specific voltage output from an output terminal thereof with a ground potential as standard.

The standard voltage generation circuit 46 is connected to the control voltage generation circuits 45 of the driver ICs IC1 to IC26, so that a specific standard voltage Vref is supplied to the control voltage generation circuits 45. Note that in the LED head 19, the power source VDD supplies a voltage of +5 V. In the printing operation, the print control unit 1 sends the print data HD-DATA3~0, the clock signal HD-CLK, the latch signal HD-LOAD, and the strobe signal HD-STB-N.

FIG. 18 is a block diagram showing a configuration of the driver IC of the conventional electro-photography printer.

As shown in FIG. 18, each of the driver ICs IC1 to IC26 includes the shift register circuit 44 formed of flip-flop circuits FFA1 to FFA49, FFB1 to FFB49, FFC1 to FFC49, and FFD1 to FFD49. Further, each of the driver ICs IC1 to IC26 includes the latch circuit 43 formed of latch circuits LTA1 to LTD1, to LTS49 to LTD49.

As shown in FIG. 18, each of the driver ICs IC1 to IC26 further includes a CTRL block or a control circuit 101; an MEM block or a memory circuit; DRV blocks or LED drive circuit sections; a resistor 102 connected between a terminal STB receiving a strobe signal of a negative logic and the power source VDD.

As shown in FIG. 18, each of the driver ICs IC1 to IC26 further includes inverter circuits 103 and 104; an AND circuit 105; and a selector circuit 107. The selector circuit 107 has input terminals A0 to A3 and B0 to B3, output terminal Y0 to Y3, and a selection input terminal S as a data terminal. When the selection input terminal S is Low, input data to the input terminals A0 to A3 are output from the output terminals Y0 to Y3. When the selection input terminal S is High, input data to the input terminals B0 to B3 are output from the output terminals Y0 to Y3.

As shown in FIG. 18, each of the driver ICs IC1 to IC26 further includes an ADJ block 106, i.e., the control voltage generation circuit 45 shown in FIG. 17. The ADJ block 106 has data input terminals S0 to S3 and a standard voltage input terminal VREF. The standard voltage input terminal VREF is connected to the standard voltage generation circuit 46 shown in FIG. 17, so that the specific voltage Vref with the ground potential as standard is applied to the standard voltage input terminal VREF.

The ADJ block 106 further has an output terminal V for outputting a control voltage Vcont to 192 of the DRV blocks. The data input terminals S0 to S3 are connected to terminals Q0 to Q3 of the MEM block, so that chip correction data stored in the MEM block are input to the data input terminals S0 to S3.

The flip-flop circuits FFA1 to FFA49 are connected in a cascade arrangement. A data input terminal D of the flip-flop circuit FFA1 is connected to a data input terminal DATAI0 of the driver IC. Further, the flip-flop circuits FFA48 and FFA49 output data to the selector circuit 107, and the output terminal Y0 of the selector circuit 107 is connected to a data output terminal DATAO0 of the driver IC.

Similarly, the flip-flop circuits FFB1 to FFB49, FFC1 to FFC49, and FFD1 to FFD49 are connected in a cascade arrangement, respectively. Data input terminals D of the flip-flop circuit FFB1, FFC1, and FFD1 are connected to data input terminals DATAI1, DATAI2, and DATAI3 of the driver IC, respectively. Further, the flip-flop circuits FFB48 and FFB49, FFC48 and FFC49, and FFD48 and FFD49 output data to the selector circuit 107. The output terminals Y1, Y2, and Y3 of the selector circuit 107 are connected to data output terminals DATAO1, DATAO2, and DATAO3 of the driver IC, respectively.

With the configuration described above, the flip-flop circuits FFA1 to FFA49, FFB1 to FFB49, FFC1 to FFC49, and FFD1 to FFD49 constitute the shift register circuits with 49 stages, respectively. Accordingly, with the selector circuit 107, it is possible to switch a shift stage between the 48-stage and the 49-stage. Clock terminals of the flip-flop circuits FFA1 to FFA49, FFB1 to FFB49, FFC1 to FFC49, and FFD1 to FFD49 are connected to the clock terminal HD-CLK of the LED head 19, thereby performing a shift operation synchronizing with the clock signal.

The data output terminals DATAO0 to DATAO3 of the driver IC are connected to the data input terminals DATAI0 to DATAI3 of the driver IC in a next stage, respectively. Accordingly, the flip-flop circuits FFA1 to FFA49 of the driver ICs IC1 to IC26 constitute the shift register circuits with the 48×26 stages or the 49×26 stages for shifting the data signal HD-DATA0 input from the print control unit 1 to the driver IC IC1, i.e., the driver IC at the first stage, synchronizing with the clock signal.

Similarly, the flip-flop circuits FFB1 to FFB49, FFC1 to FFC49, and FFD1 to FFD49 of the driver ICs IC1 to IC26 constitute the shift register circuits with the 48×26 stages or the 49×26 stages, respectively, for shifting the data signals HD-DATA1, HD-DATA2, and HD-DATA3 input from the print control unit 1 to the driver IC IC26, i.e., the driver IC at the first stage, synchronizing with the clock signal, respectively.

The latch circuits LTA1 to LTA48, LTB1 to LTB48, LTC1 to LTC48, and LTD1 to LTD48 operate according to a latch signal LOAD-P input to the HD-LOAD terminal of the LED head. The latch circuits LTA1 to LTA48 latch the data signal HD-DATA0 stored in the flip-flop circuits FFA1 to FFA49. Similarly, the latch circuits LTB1 to LTB48, LTC1 to LTC48, and LTD1 to LTD48 latch the data signals HD-DATA1, HD-DATA2, and HD-DATA3 stored in the flip-flop circuits FFB1 to FFB49, FFC1 to FFC49, and FFD1 to FFD49, respectively.

One input terminal of the AND circuit 105 is connected to a terminal STB of the driver IC through the inverter 103, and is connected to the strobe signal input terminal HD-STB-N of the LED head. The other input terminal of the AND circuit 105 is connected to a terminal LOAD of the driver IC through the inverter 104, so that the latch signal input to the load signal input terminal HD-LOAD of the LED head is input to the other input terminal.

An output terminal of the AND circuit 105 is connected to drive on-off terminals S of the LED drive sections DRV. When the load signal input terminal signal of the LED head is Low (the LOAD-P signal is Low), and the strobe signal input terminal HD-STB-N is at a Low level, an output of the AND circuit 105 becomes High, so that the AND circuit 105 generates a signal for controlling on-off of the drive of the LED drive sections according to the LOAD-P.

FIG. 19 is circuit diagram showing a main portion of the LED drive section of the driver IC shown in FIG. 18. In FIG. 19, the inverter circuit 41 and the AND circuit 42 are those shown in FIG. 17. The strobe signal of the negative logic (not shown) is input to an input terminal of the inverter circuit 41. An output terminal of the inverter circuit 41 is connected to one input terminal of the AND circuit 42.

A latch circuit 51 is a portion corresponding to one LED element among the latch circuits 43 shown in FIG. 17. An input terminal D of the latch circuit 51 is connected to an output terminal of a shift transistor (not shown, corresponding to the shift transistor 44 shown in FIG. 17). Further, an input terminal G of the latch circuit 51 is connected to the latch signal HD-LOAD, and an output terminal Q of the latch circuit 51 is connected to the other input terminal of the AND circuit 42.

As shown in FIG. 19, an inverter circuit 52 is formed of a PMOS transistor 53 and an NMOS transistor 54. A source of the PMOS transistor 53 is connected to the power source VDD. A source of the NMOS transistor 54 is connected to an output terminal of a calculation amplifier (described later), so that a potential Vcont is applied to the source of the NMOS transistor 54.

A gate of the PMOS transistor 53 is connected to a gate of the NMOS transistor 54, and is further connected to the output terminal of the AND circuit 42. A gate terminal of a PMOS transistor Tr1 is connected to drain terminals of the PMOS transistor 53 and the NMOS transistor 54. An LED element LED1 is also provided.

A control voltage generation circuit 106 shown as an area circled with a hidden line is provided for correcting the variance in the light amount. The control voltage generation circuit 106 corresponds to the control voltage generation circuit 45 shown in FIG. 17 or the ADJ block shown in FIG. 18.

The control voltage generation circuit 106 includes a calculation amplifier 55 and a PMOS transistor 56. The PMOS transistor 56 has a gate length same as that of the PMOS transistor Tr1, and a source terminal thereof is connected to the power source VDD.

When the NMOS transistor 54 is turned on, the PMOS transistor 53 becomes an off state. The PMOS transistor Tr1 has a gate potential same as that of the Vcont potential. Accordingly, the PMOS transistor 56 has a gate-source voltage same as that of the PMOS transistor Tr1, thereby constituting a current-mirror relationship.

As well known in the art, in order to operate a circuit as a current-mirror circuit, it is necessary to carefully adjust an operational condition, so that the PMOS transistor 56 and the PMOS transistor Tr1 operate in a saturated region.

An inversion input terminal of the calculation amplifier 55 is connected to a VREF terminal, so that a potential Vref is applied to the inversion input terminal. A non-inversion input terminal of the calculation amplifier 55 is connected to an output terminal Y of a multiplexer 57 (described later). An output terminal of the calculation amplifier 55 is connected to the gate terminal of the PMOS transistor 56 and the source terminal of the NMOS transistor 54. Note that the output terminal of the calculation amplifier 55 has a potential Vcont.

The multiplexer 57 includes resistors R0 to R15; input terminals P0 to P15 for receiving an analog voltage; the output terminal Y for outputting an analog voltage; and input terminals S0 to S3 for receiving a logic signal. Through 16 combinations of 16 signal logics defined by four logic signals, one of the input terminals P0 to P15 is selected, and a potential applied to the one input terminal is output from the output terminal Y.

A control feedback circuit is formed of the calculation amplifier 55, the resistors R0 to R15, and the PMOS transistor 56, so that the non-inversion input terminal of the calculation amplifier 55 has a potential same as the standard voltage Vref. Accordingly, a drain current Iref of the PMOS transistor 56 is determined from a combined resistivity of one of the resistors R0 to R15 selected by the multiplexer 57 and the standard voltage Vref input to the calculation amplifier 55.

For example, consider a case that the input terminal selection signals S0 to S3 become "0000". In this case, the input terminal P0 of the multiplexer 57 is selected, and the input terminal P0 and the output terminal Y are turned on. Further, the combined resistivity Rx between the input terminal P0 and the ground is given by:

$$Rx=R0+R1+R2+R3+R4+R5+R6+R7+R8+R9+R10+R11+R12+R13+R14+R15$$

Further, the drain current Iref of the PMOS transistor 56 is given by:

$$Iref=Vref/(R0+R1+R2+R3+R4+R5+R6+R7+R8+R9+R10+R11+R12+R13+R14+R15)$$

As another example, consider a case that the input terminal selection signals S0 to S3 become "0111". In this case, the input terminal P7 of the multiplexer 57 is selected, and the input terminal P7 and the output terminal Y are turned on. The combined resistivity Rx between the input terminal P7 and the ground is given by:

$$Rx=R0+R1+R2+R3+R4+R5+R6+R7+R8$$

Further, a combined resistivity Ry between the input terminal P7 and the power source VDD is given by:

$$Rx=R9+R10+R11+R12+R13+R14+R15$$

Further, the drain current Iref of the PMOS transistor 56 is given by:

$$Iref=Vref/(R0+R1+R2+R3+R4+R5+R6+R7+R8)$$

As a further example, consider a case that the input terminal selection signals S0 to S3 become "1111". In this case, the input terminal P15 of the multiplexer 57 is selected, and the input terminal P15 and the output terminal Y are turned on. The combined resistivity Rx between the input terminal P7 and the ground is given by:

$$Rx=R0$$

Further, the drain current Iref of the PMOS transistor 56 is given by:

$$Iref=Vref/R0$$

As described above, the PMOS transistor 56 and the PMOS transistor Tr1 shown in FIG. 19 are configured to have the current-mirror relationship. Accordingly, a current value flowing through the PMOS transistor Tr1 is proportional to the drain current Iref flowing through the PMOS transistor 56. As a result, as shown in FIG. 19, when the input terminal selection signals S0 to S3 in four bits are changed in 16 combinations, it is possible to change the current value flowing through the PMOS transistor Tr1 in 16 stages.

At this time, each of the driver ICs has 192 of the inverter circuits 52 and 192 of the PMOS transistors Tr1 and the likes. Accordingly, it is possible to change the current values flowing through 192 of the PMOS transistors Tra and the likes in the 16 stages according to the drain current Iref flowing through the PMOS transistor 56.

FIG. 20 is a table showing a change in the LED drive current per chip of the driver IC. In the conventional electrophotography printer shown in FIG. 19, correction data per chip is given as a digital value in 4 bits. Accordingly, the input terminal selection signals S0 to S3 change among the sixteen combinations from "0000" to "1111".

Consider a case that the input terminal selection signals S0 to S3 are "0111" as a center (±0%). Further, supposed that the LED drive current changes as 3% as unit upon a change in the input terminal selection signals S0 to S3. As shown in FIG. 20, when the input terminal selection signals S0 to S3 are "0000", the LED drive current changes by −21%. Further, when the input terminal selection signals S0 to S3 are "1111", the LED drive current changes by +24%.

FIG. 21 is a circuit diagram for explaining an operation of the circuit shown in FIG. 19. The corresponding elements are designated with the same numeral references, and the multiplexer 57 shown in FIG. 19 is simplified.

As shown in FIG. 21, resistors Rx, Ry, and Rz are provided, in which the resistor Rx represents a resistor between an arbitrary one of the input terminals P0 to P15 and the output terminal Y in the multiplexer 57 shown in FIG. 19. The resistor Rx represents a combined resistor of a resistor row disposed between the selected input terminal of the multiplexer 57 and the ground. The resistor Ry represents a combined resistor of a resistor row disposed between the selected input terminal of the multiplexer 57 and the drain terminal of the PMOS transistor 56.

A sum of the resistors Rx and Ry is equal to a total resistivity of the resistor R0 to R15 connected in series. That is:

$$Rx+Ry=R0+R1+R2+R3+R4+R5+R6+R7+R8+R9+R10+R11+R12+R13+R14+R15$$

As shown in FIG. 21, a control feedback circuit is formed of the calculation amplifier 55, the resistor row Rx, and the PMOS transistor 56, so that the non-inversion input terminal of the calculation amplifier 55 has a potential substantially same as the standard voltage Vref through the operation of the calculation amplifier 55.

Accordingly, a potential between both ends of the resistor RX is equal to a product of the resistor Rx and the drain current Iref of the PMOS transistor 56. The potential between both ends of the resistor RX is also equal to the voltage Vref applied to the non-inversion input terminal of the calculation amplifier 55. Accordingly, the following relationship is established:

$$Iref=Vref/Rx$$

From the equation above, a drain potential Vd of the PMOS transistor 56 is given by:

$$Vd=(Rx+Ry)\times Iref=Vref\times(1+Ry/Rx)$$

Note that the resistor Rz shown in FIG. 21 is connected to the non-inversion input terminal of the calculation amplifier 55, and an input impedance of the non-inversion input terminal may be considered as infinite. Accordingly, a resistivity of the resistor Rz does not influence on the operation of the circuit shown in FIG. 21 to a large extent. That is, the on-resistor of the multiplexer 57 shown in FIG. 19 does not influence on the operation of the circuit, thereby providing an advantage in circuit design.

A change in the drain potential Vd of the PMOS transistor 56 with various standard currents will be explained next. First, with reference to FIG. 20, a drain current Iref0 will be calculated. The drain current Iref0 is the drain current Iref of the PMOS transistor 56 when the chip correction value becomes minimum. The drain current Iref of the PMOS transistor 56 at the correction center is designated with Iref7.

The drain current Iref0 is smaller than the drain current Iref7 by 21%.

$$Iref0=Iref7\times(1-0.21)$$

At this time, the drain potential Vd0 of the PMOS transistor 56 is given by:

$$Vd0=(Rx+Ry)\times Iref0=(Rx+Ry)\times Iref7\times(1-0.21)$$

From the above relationship, the following relationship is obtained:

$$Rx+Ry=Vd0/(Iref7\times(1-0.21))$$

At this time, since Ry is equal to zero, Vd0 is equal to Vref. Accordingly, the following relationship is obtained:

$$Rx+Ry=Vref/(Iref7\times(1-0.21))$$

Next, a drain current Iref15 will be calculated. The drain current Iref15 is the drain current Iref of the PMOS transistor 56 when the chip correction value becomes maximum.

The drain current Iref15 is greater than the drain current Iref7 by +24%.

$$Iref15=Iref7\times(1+0.24)$$

Accordingly, the drain potential Vd15 of the PMOS transistor 56 is given by:

$$Vd15=(Rx+Ry)\times Iref15=(Rx+Ry)\times Iref7\times(1+0.24)$$

At this time, (Rx+Ry) has a constant value. Accordingly, the following relationship is established:

$$Vd15=Vref\times(1+0.24)/(1-0.21)\approx 1.57\times Vref$$

Another conventional example will be explained next. FIG. 22 is a circuit diagram of another conventional example corresponding to the circuit diagram shown in FIG. 21.

In the LED element LED1 described above, the cathode terminal thereof is commonly connected to the ground, i.e., the cathode-common arrangement. In the circuit diagram shown in FIG. 22, on the other hand, it is arranged such that the anode terminal of the LED element LED1 can be connected to the power source VDD, i.e., the anode-common arrangement.

In the circuit diagram shown in FIG. 22, elements corresponding to those in FIG. 21 are designated with the same reference numerals. The resistors Rx, Ry, and Rz in FIG. 22 represent simplified models of the resistor R0 to R15 and the multiplexer 57 shown in FIG. 19.

The circuit diagram shown in FIG. 22 includes the inverter circuit 41 and the AND circuit 42 corresponding to those shown in FIG. 17 and FIG. 19. A strobe signal of a negative logic (not shown) is input to the input terminal of the inverter circuit 41. The output terminal of the inverter circuit 41 is connected to one input terminal of the AND circuit 42.

Similar to that shown in FIG. 19, the latch circuit 51 is a portion corresponding to the LED element LED1 among the latch circuits 43 shown in FIG. 17. The input terminal D of the latch circuit 51 is connected to the output terminal of the shift transistor (not shown, corresponding to the shift transistor 44 shown in FIG. 17). Further, the input terminal G of the latch circuit 51 is connected to the latch signal HD-LOAD, and the output terminal Q of the latch circuit 51 is connected to the other input terminal of the AND circuit 42.

As shown in FIG. 22, similar to that in FIG. 19, the inverter circuit 52 is formed of the PMOS transistor 53 and the NMOS transistor 54. The source of the NMOS transistor 54 is connected to the ground. The source of the PMOS transistor 53 is connected to the output terminal of the calculation amplifier (described later), so that the potential Vcont is applied to the source of the PMOS transistor 53.

The gate of the PMOS transistor 53 is connected to the gate of the NMOS transistor 54, and is further connected to the output terminal of the AND circuit 42. A gate terminal of a NMOS transistor 59 is connected to the drain terminals of the PMOS transistor 53 and the NMOS transistor 54. The LED element LED1 is also provided.

Further, the calculation amplifier 55 and a NMOS transistor 58 are provided. The NMOS transistor 58 has a gate length same as that of the NMOS transistor 59, and a source terminal thereof is connected to the ground.

The resistors Rx, Ry, and Rz are shown in FIG. 22, and the resistor Rz represents the on-resistor between an arbitrary one of the input terminals P0 to P15 and the output terminal Y of the multiplexer 57 shown in FIG. 19. The resistor Rx represents a combined resistor of a resistor row disposed between a selected input terminal of the multiplexer 57 and the power source VDD. The resistor Ry represents a combined resistor of a resistor row disposed between the selected input terminal of the multiplexer 57 and the drain terminal of the PMOS transistor 56.

When the PMOS transistor 53 is turned on, the NMOS transistor 54 becomes an off state. The NMOS transistor 59 has a gate potential same as that of the Vcont potential. Accordingly, the NMOS transistor 58 has a gate-source voltage same as that of the NMOS transistor 59, thereby constituting a current-mirror relationship.

The inversion input terminal of the calculation amplifier 55 is connected to the terminal VREF, so that the potential Vref is applied to the non-inversion input terminal as a standard potential. The non-inversion input terminal of the calculation amplifier 55 is connected to a connection middle point between the resistors Rx and Ry. The output terminal of the calculation amplifier 55 is connected to the gate terminal of the NMOS transistor 58 and the source terminal of the PMOS transistor 53. Note that the output terminal of the calculation amplifier 55 has the potential Vcont.

In comparison between FIG. 21 and FIG. 22, as a first difference, while the PMOS transistor drives the LED element LED1 in FIG. 21, the NMOS transistor drives the LED element LED1 in FIG. 22. Further, as a second difference, the potential Vref is applied as the standard potential in FIG. 21, and the potential Vref is defined relative to the ground. On the other hand, the potential Vref is defined relative to the power source VDD in FIG. 22.

Well known from the electron physics theory, an element area of an MOS transistor is determined inversely proportional to a mobility of carriers such as electrons and holes flowing in the MOS transistor. When a semiconductor formed of a silicon material is operated at a room temperature, the mobility of electrons is three times greater than that of holes. Accordingly, when a PMOS transistor is switched to an NMOS transistor, it is possible to reduce an element area to one-third.

In view of the first difference between FIG. 21 and FIG. 22, with the configuration shown in FIG. 21, it is possible to reduce an IC chip area as opposed to that shown in FIG. 22, thereby improving cost.

In view of the second difference between FIG. 21 and FIG. 22, in the configuration shown in FIG. 21, the standard voltage generation circuit 46 shown in FIG. 17 generates the potential Vref, and can be obtained as a three-terminal regulator circuit IC.

In the configuration shown in FIG. 22, on the other hand, it is necessary to define the potential Vref relative to the power source VDD. In the prior art, it is difficult to generate the potential Vref without increasing cost.

Further, when a standard voltage generation circuit is used for generating a specific standard potential relative to the ground, it is difficult to drive an LED element with the anode-common arrangement with a simple circuit.

Patent Reference 2 has disclosed a circuit for driving an LED element with the anode-common arrangement. The circuit includes two calculation amplifiers, i.e., a first calculation amplifier and a second calculation amplifier.

Patent Reference 2: Japanese Patent Publication No. 3408193

According to Patent Reference 2, the first calculation amplifier converts a standard voltage relative to a ground potential to a standard voltage relative to a power source potential. The second calculation amplifier generates a specific standard current according to the standard voltage thus converted.

With the configuration disclosed in Patent Reference 2, it is necessary to provide a plurality of calculation amplifiers, thereby increasing a chip area and cost.

As described above, if the issue associated with the second difference can be solved, it is possible to take advantage of the features associated with the first difference. However, in the prior art, it is difficult to solve the issue associated with the second difference.

FIG. 23 is a graph showing static characteristics of the PMOS transistor 56 shown in FIG. 21. In FIG. 23, the horizontal axis represents a voltage between the drain and the source Vds, and the vertical axis represents a drain current Id. The graph is drawn with a voltage between the gate and the source Vgs as a parameter.

As shown in FIG. 23, an area on the right side of a pinch-off point indicated with a hidden line becomes an saturated region, in which the drain current Id maintains a constant level. An area on the left side of the hidden line becomes a linear region, in which the drain current Id changes with the voltage between the gate and the source Vgs.

As described above, in the circuit diagram shown in FIG. 21, it is necessary to maintain the current-mirror relationship between the PMOS transistor 56 and the PMOS transistor Tr1. Accordingly, it is necessary to operate the PMOS transistor 56 and the PMOS transistor Tr1 in the saturated region.

As calculated above, in the circuit diagram shown in FIG. 21, when the chip correction rate becomes maximum, the drain potential of the PMOS transistor increases, thereby decreasing the voltage between the gate and the source thereof. More specifically, when the chip correction rate becomes maximum, the drain potential of the PMOS transistor is calculated to be about Vd15≈1.57×Vref. At this time, the voltage between the gate and the source Vgs of the PMOS transistor 56 is Vds=VDD−Vd15.

Accordingly, in order for the PMOS transistor 56 to operate in the saturated region, the following equation needs to be satisfied:

$$Vds \geqq Vgs - Vt$$

where Vt is a threshold value of the PMOS transistor 56.

As a typical case, it is assumed that Vgs=2 V, Vt=0.7 V, Vref=1.5 V, VDD=5.0 V. In this case, Vds=1.57×Vref=5−1.57×1.5≈2.65, and Vgs−Vt=2.0−0.7=1.3. Accordingly, Vds is greater than Vgs−Vt, thereby confirming that the PMOS transistor 56 operates in the saturated region.

On the other hand, when VDD=3.3 V, Vds=VDD−1.57×Vref=3.3−1.57×1.5≈0.95. In this case, Vds is smaller than Vgs−Vt (Vds<Vgs−Vt). Accordingly, it is difficult to maintain the current-mirror relationship between the PMOS transistor 56 and the PMOS transistor Tr1, thereby making it difficult to normally operate the circuit shown in FIG. 21.

With the recent advancement in the semiconductor manufacturing process technology, a size of an MOS transistor has been drastically reduced. As a result, a withstand voltage of the MOS transistor tends to decrease, thereby making it necessary to decrease a power voltage of an IC including the MOS transistor.

For example, a conventional standard power voltage of 5 V has decreased to 3.3 V to 2.5 V. As apparent from the trend, it is necessary to decrease the power voltage with decreasing the size of the MOS transistor.

As described above, in the conventional technology, when the power voltage is 5 V, the circuit can be operated normally. However, when the power voltage is 3.3 V, it is difficult to operate the circuit. It has been required to provide a circuit capable of operating at the power voltage of 3.3 V, lower than the conventional standard power voltage.

Further, in the circuit shown in FIG. 22, it is necessary to generate the specific potential difference (Vref) relative to the power source VDD. However, in the prior art, it is difficult to obtain a circuit without increasing cost. For this reason, while the LED head shown in FIG. 21 has been commercialized, it is difficult to realize the configuration shown in FIG. 22.

In view of the problems described above, an object of the present invention is to provide a drive circuit capable of solving the problems of the conventional drive circuit.

Further objects and advantages of the invention will be apparent from the following description of the invention.

SUMMARY OF THE INVENTION

In order to attain the objects described above, according to the present invention, a drive circuit is provided for selectively driving a group of a plurality of driven elements. The drive circuit includes a group of drive elements disposed corresponding to each of the driven elements for driving the driven elements; a correction data input section for adjusting a drive current of the driven element per group of the drive elements; and a control voltage generation section for generating a direction value of the drive current of the driven element according to correction data input from the correction data input section.

The control voltage generation section includes a calculation amplifier; a first conductive type transistor; and a current-mirror circuit including a control side transistor and a follower side transistor formed of second conductive type transistors. A first input terminal of the calculation amplifier is connected to a standard voltage. The control side transistor of the current-mirror circuit is formed of a plurality of transistors. An on-off state of the transistors can be controlled with the correction data.

A current output terminal of the control side transistor formed of a plurality of transistors is connected to a first terminal of the first conductive type transistor. A second terminal of the first conductive type transistor is connected to ground. A current output terminal of the follower side transistor is connected to an end portion of a resistor and a second input terminal of the calculation amplifier. The other end portion of the resistor is connected to the ground. An output of the calculation amplifier is connected to a control terminal of the first conductive type transistor.

With the configuration of the present invention, the first conductive type transistor drives the driven element. Accordingly, it is possible to drive an anode-common type driven element, thereby reducing a necessary transistor area. Further, it is possible to decrease a power voltage, and to adopt a manufacturing rule for a reduced size IC. As a result, it is possible to reduce a chip size and power consumption.

BRIEF DESCRIPTION OF THE DRAWINGS

FIG. 20 is a table showing light amount correction data of the conventional electro-photography printer;

DETAILED DESCRIPTION OF PREFERRED EMBODIMENTS

Figure 1:
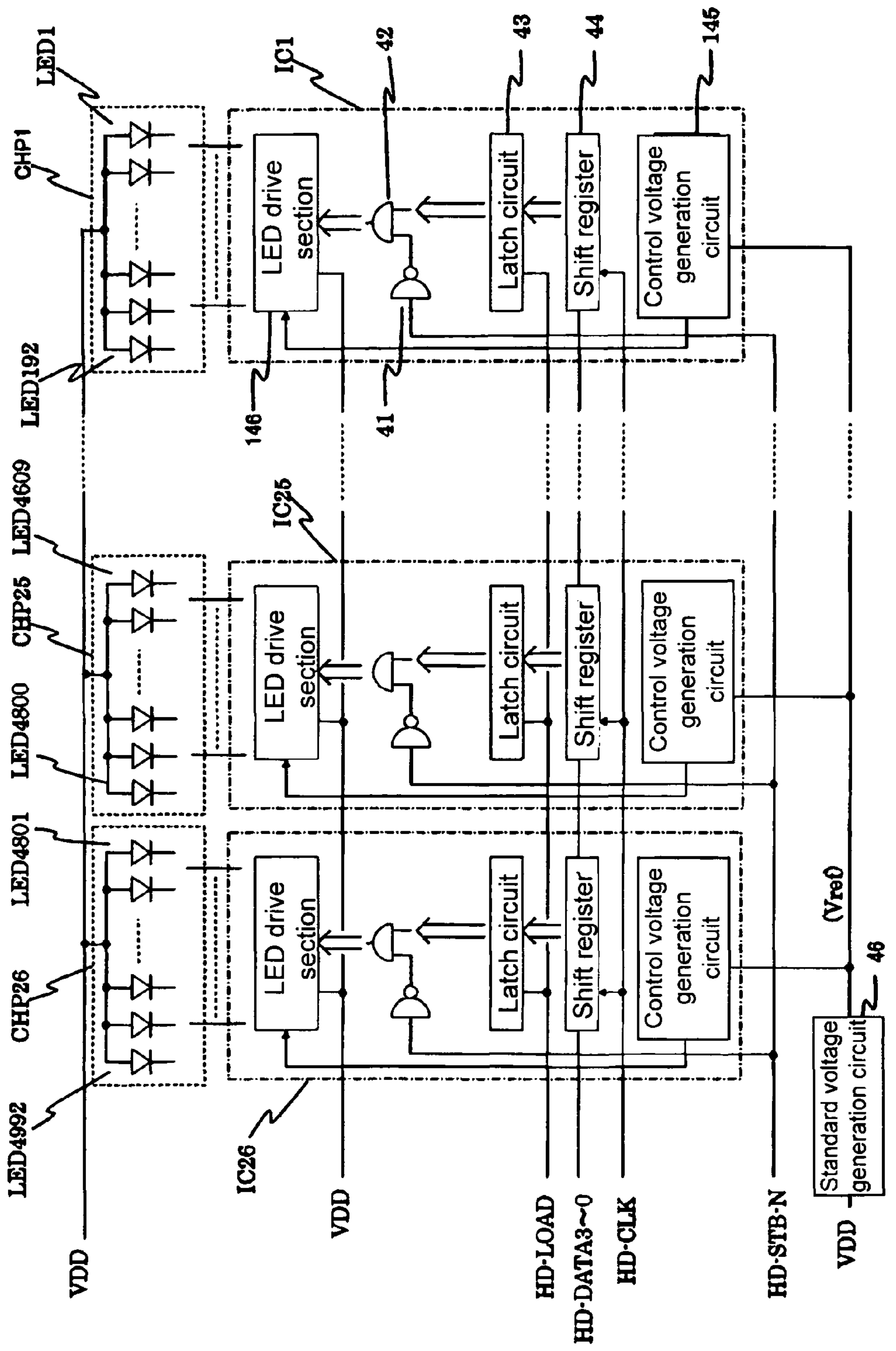
FIG. 1 is a block diagram showing a configuration of an LED (Light Emitting Diode) head according to a first embodiment of the present invention.

Hereunder, preferred embodiments of the present invention will be explained with reference to the accompanying drawings. Similar components in the drawings are designated with the same reference numerals.

First Embodiment

Figure 2:
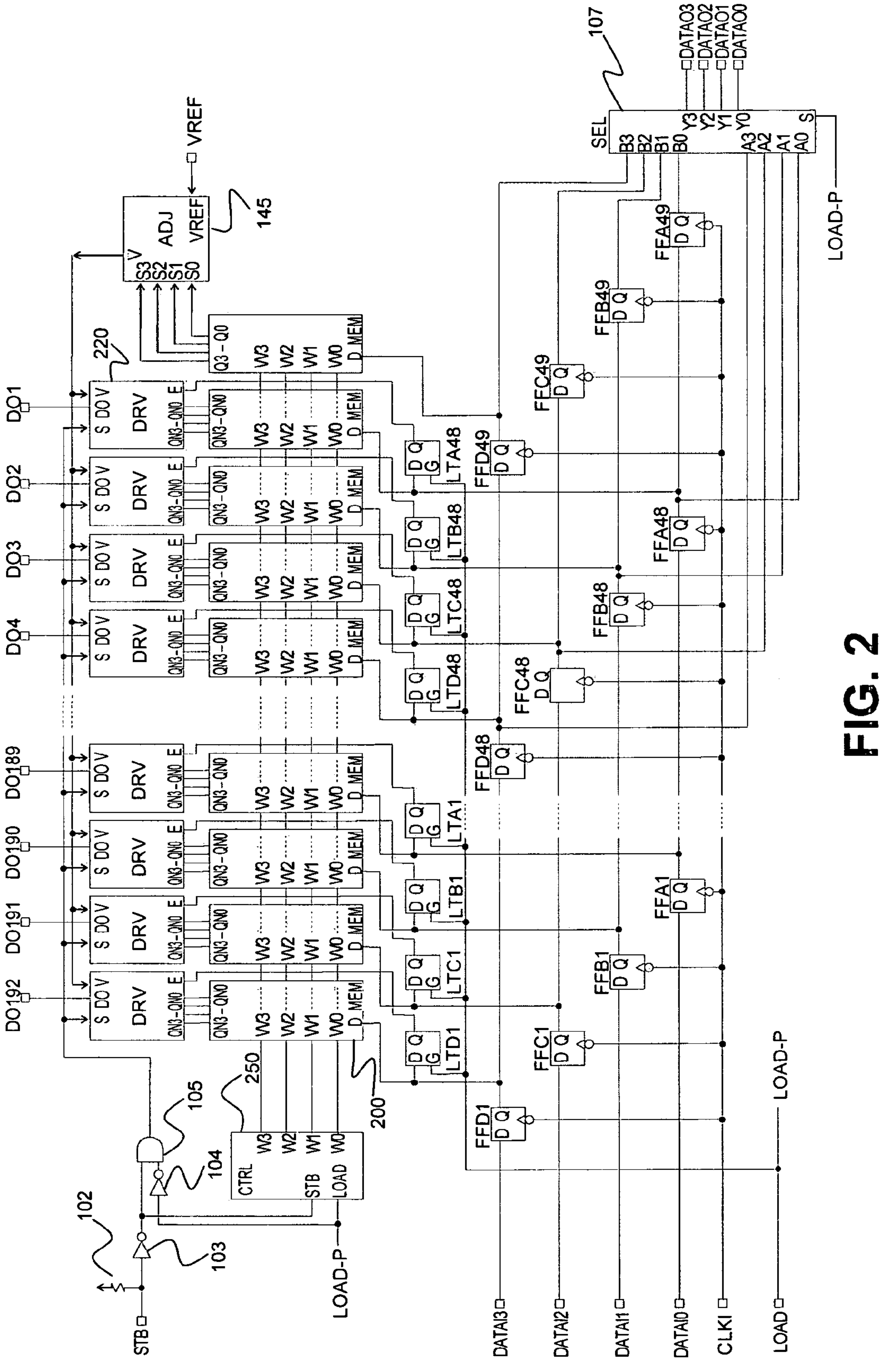
FIG. 2 is a block diagram showing a configuration of a driver IC (Integrated Circuit) according to the first embodiment of the present invention.

A first embodiment of the present invention will be explained. FIG. 1 is a block diagram showing a configuration of an LED (Light Emitting Diode) head of an electro-photography printer according to the first embodiment of the present invention. FIG. 2 is a block diagram showing a configuration of a driver IC (Integrated Circuit) of the LED head according to the first embodiment of the present invention.

As shown in FIG. 1, the LED head includes 26 LED arrays CHP1 to CHP26, and each of the LED arrays CHP1 to CHP26 includes 192 LED elements (for example, LED elements LED1 to LED192 are disposed in the LED array CHP1). In the LED array, an anode terminal of each of the LED elements is connected to with each other, thereby constituting an anode-common arrangement.

In the embodiment, driver ICs IC1 to IC26 in the same number as that of the LED arrays are arranged to correspond to the LED arrays. Each of the driver IC IC1 to IC26 includes a control voltage generation circuit 145; a shift register 44; a latch circuit 43; an inverter circuit 41; a logical multiplication circuit (AND circuit) 42; and an LED drive section 146. The shift register 44, the latch circuit 43, the inverter circuit 41, and the logical multiplication circuit (AND circuit) 42 have configurations similar to those in the conventional IC driver described in the section of “BACKGROUND OF THE INVENTION AND RELATED ART STATEMENT”.

The shift register 44 shown in FIG. 1 is formed of flip-flop circuits FFA1 to FFA49, FFB1 to FFB49, FFC1 to FFC49, and FFD1 to FFD49 shown in FIG. 2. The latch circuit 43 shown in FIG. 1 is formed of latch circuits LTA1 to LTD1, to LTS49 to LTD49 shown in FIG. 2.

As shown in FIG. 2, the IC driver includes a control circuit 250 (CTRL block); memory circuits 200 (MEM block); and LED drive circuits 220 (DRV block). The control circuit 250 (CTRL block); the memory circuits 200 (MEM block); and the LED drive circuits 220 (DRV block) will be explained in more detail later.

Figure 18:
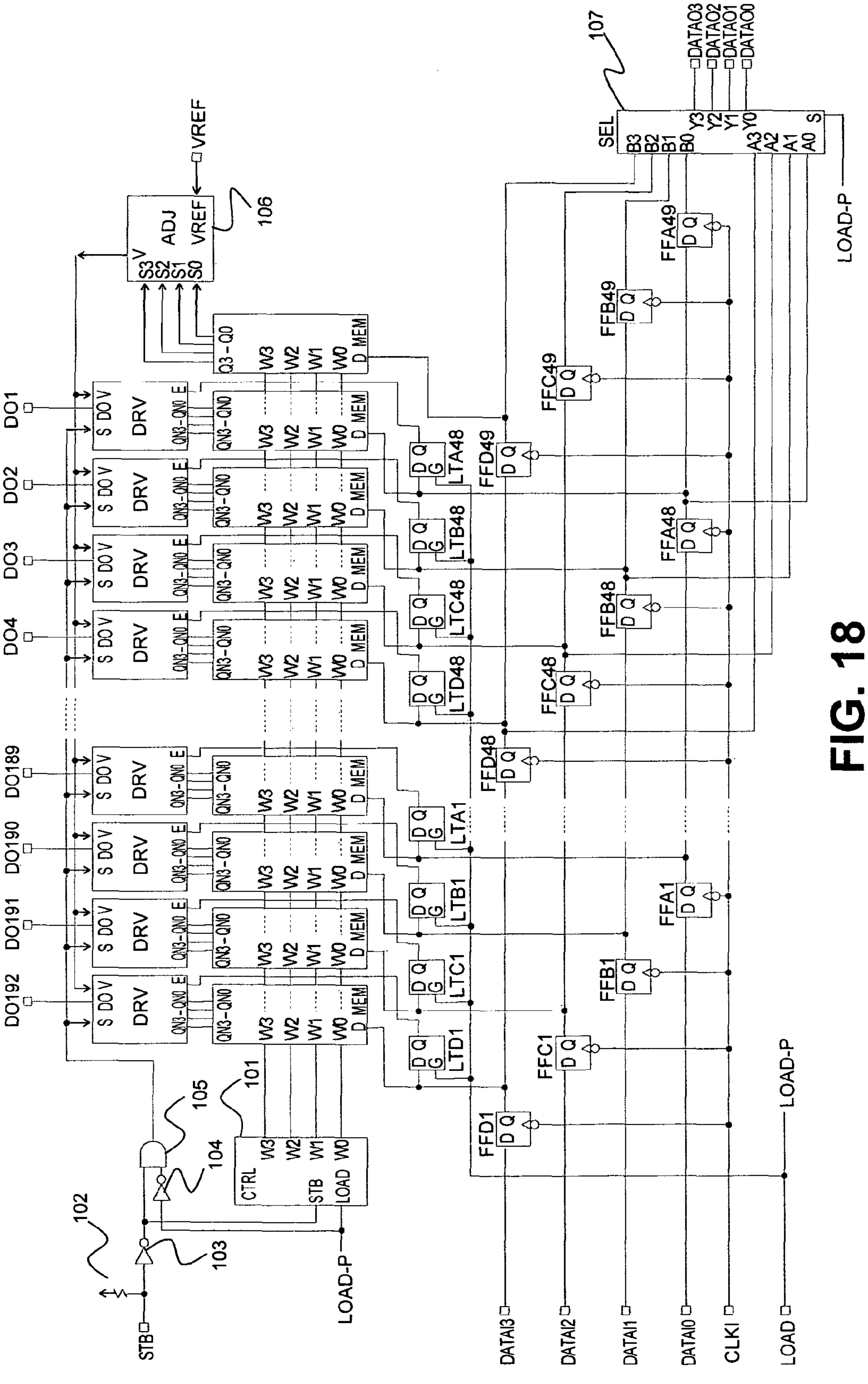
FIG. 18 CONVENTIONAL ART
FIG. 18 is a block diagram showing a configuration of a driver IC of the conventional electro-photography printer.

As shown in FIG. 2, the IC driver further includes a resistor 102; inverter circuits 103 and 104; an AND circuit 105; and a selector circuit 107. The resistor 102 is connected between a terminal STB for receiving a strobe signal of a negative logic and a power source VDD. The resistor 102; the inverter circuits 103 and 104; the AND circuit 105; and the selector circuit 107 have configurations similar to those in the conventional IC driver shown in FIG. 18, and explanations thereof are omitted. The IC driver further includes a control voltage generation circuit 145 (ADJ block).

Figure 3:
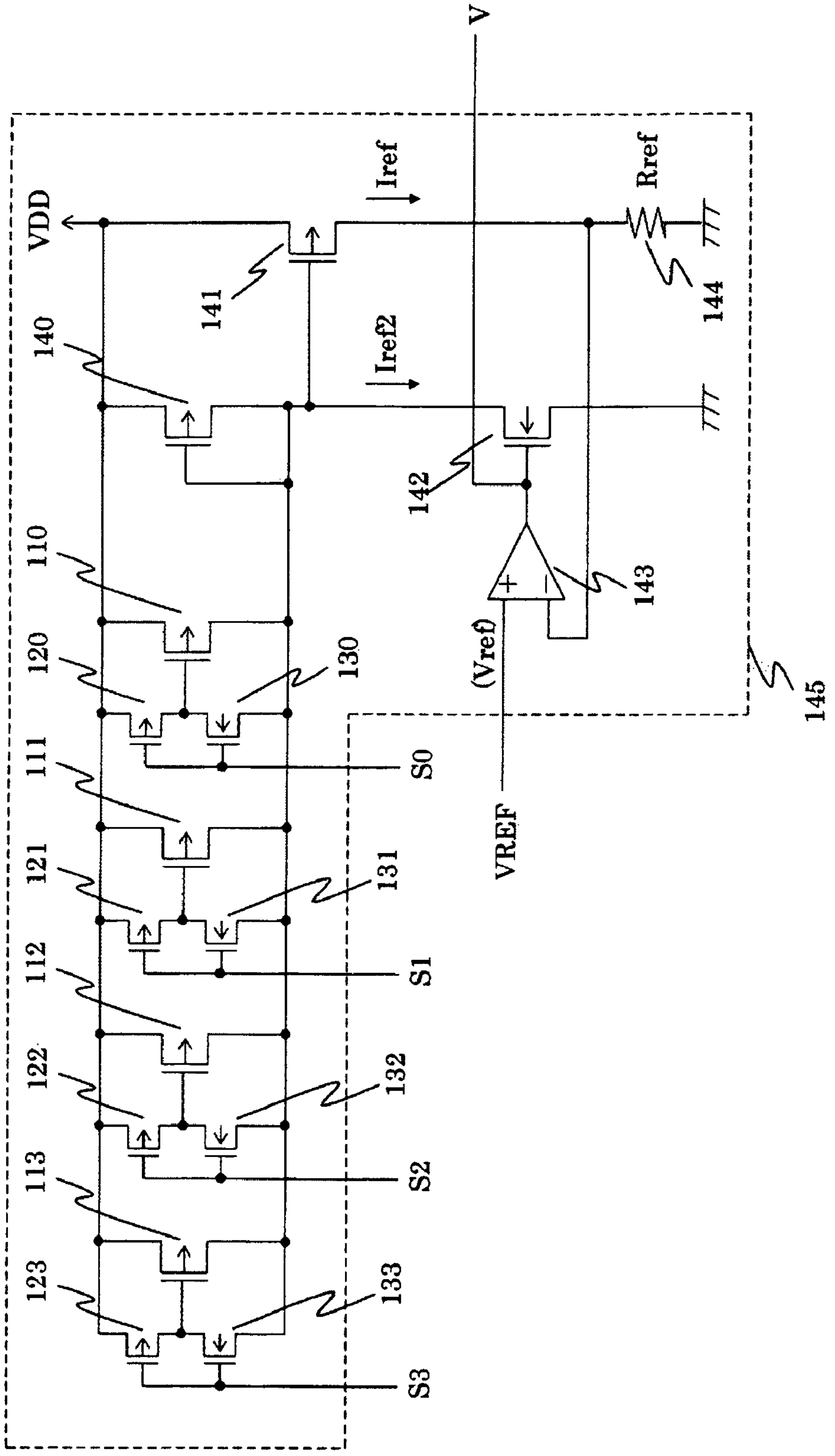
FIG. 3 is a circuit diagram showing a control voltage generation circuit according to the first embodiment of the present invention.

FIG. 3 is a circuit diagram showing the control voltage generation circuit 145 according to the first embodiment of the present invention.

As shown in FIG. 3, the control voltage generation circuit 145 includes PMOS (P-channel Metal Oxide Semiconductor) transistors 110 to 113 and 120 to 123; NMOS (N-channel Metal Oxide Semiconductor) transistors 130 to 133; PMOS transistors 140 and 141; an NMOS transistor 142; a calculation amplifier 143; and a resistor 144.

In the embodiment, sources of the PMOS transistors 110 to 113, 120 to 123, 140, and 141 are connected to the power source VDD. Drains of the PMOS transistors 120 to 123 are connected to drains of the NMOS transistors 130 to 133, respectively. Gates of the PMOS transistors 120 to 123 are connected to gates of the NMOS transistors 130 to 133, respectively, and are further connected to correction data input terminals S0, S1, S2, and S3, respectively. The correction data input terminals S0, S1, S2, and S3 receive correction data per chip.

In the embodiment, gates of the PMOS transistors 110 to 113 are connected to drains of the PMOS transistors 120 to 123, respectively. Sources of the NMOS transistors 130 to 133 are connected to drains of the PMOS transistors 110 to 113, and a gate and a drain of the PMOS transistor 140, respectively. The sources of the NMOS transistors 130 to 133 are further connected to a gate of the PMOS transistor 141 and a drain of the NMOS transistor 142. A source of the PMOS transistor 141 is connected to the power source VDD, and a drain of the PMOS transistor 141 is connected to ground through the resistor 141.

In the embodiment, a non-inversion input terminal of the calculation amplifier 143 is connected to an input terminal VREF, and an inversion input terminal of the calculation amplifier 143 is connected to one end portion of the resistor 144. An output terminal of the calculation amplifier 143 is connected to the gate of the NMOS transistor 142, and an output terminal V. The PMOS transistors 110 to 113, 140, and 141 have a same gate length. The PMOS transistor 110 to 113 have gate widths in a ratio of 1:2:4:8.

Figure 4:
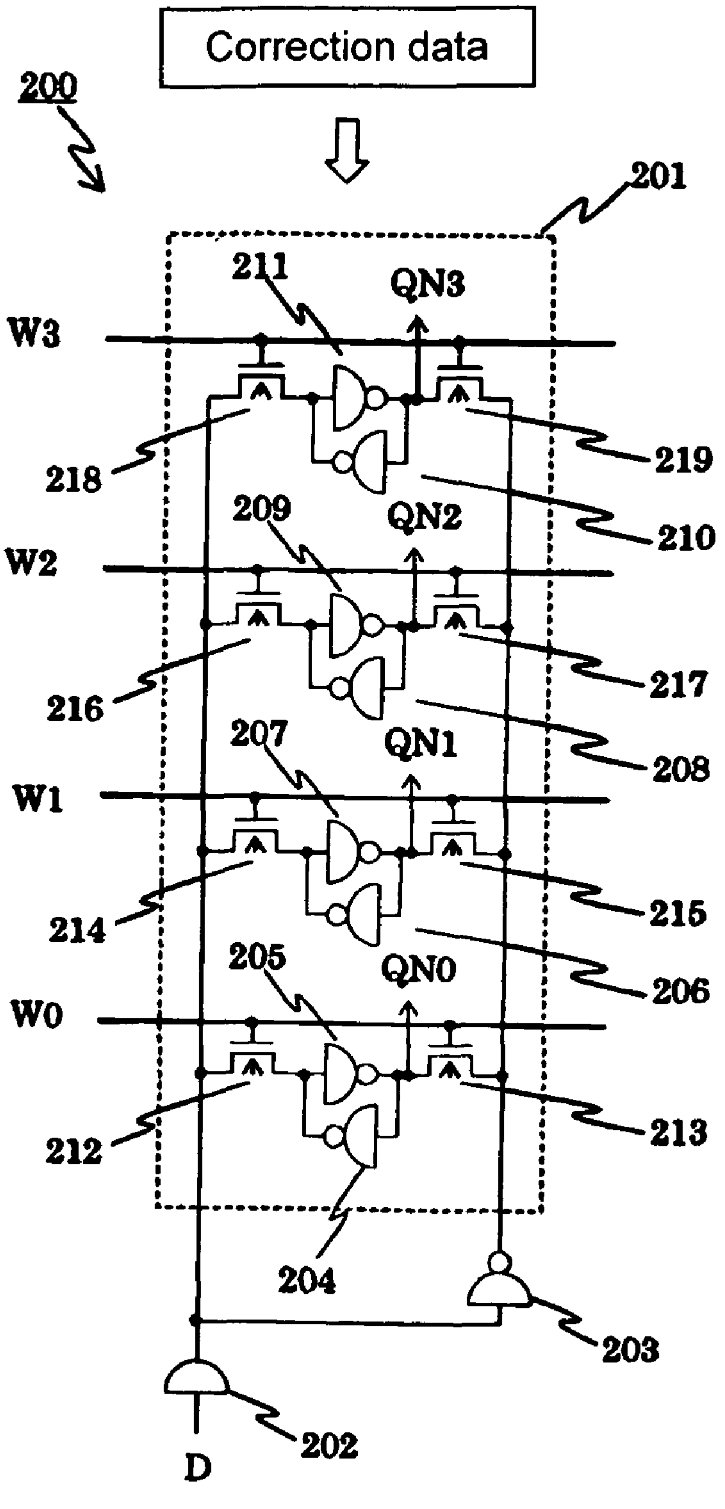
FIG. 4 is a circuit diagram showing a memory circuit according to the first embodiment of the present invention.

FIG. 4 is a circuit diagram showing the memory circuit 200 (refer to FIG. 2) according to the first embodiment of the present invention. One IC driver includes 192 memory circuits 200 having an identical configuration, and the configuration thereof will be explained next.

As shown in FIG. 4, the memory circuit 200 includes a memory cell circuit 201 (indicated by a hidden line); a buffer circuit 202; and an inverter 203. Further, the memory circuit 200 includes a correction data input terminal D; memory cell selection terminals W0 to W3; and correction data output terminals QN0 to QN3. The memory cell circuit 201 is formed of inverters 204 to 211 and NMOS transistors 212 to 219.

As shown in FIG. 4, the buffer circuit 202 has the correction data input terminal D as an input terminal thereof. An output terminal of the buffer circuit 202 is connected to an input terminal of the inverter 203, and is further connected to first terminals of the NMOS transistors 212, 214, 216, and 218. An output terminal of the inverter 203 is connected to first terminals of the NMOS transistors 213, 215, 217, and 219.

In the embodiment, the inverter 204 is connected to the inverter 205 in series. Similarly, the inverter 206 is connected to the inverter 207 in series; the inverter 208 is connected to the inverter 209 in series; and the inverter 210 is connected to the inverter 211 in series, thereby constituting the memory cell circuit 201.

In the embodiment, second terminals of the NMOS transistors 212, 214, 216, and 218 are connected to input terminals of the inverters 205, 207, 209, and 211. Second terminals of the NMOS transistors 213, 215, 217, and 219 are connected to input terminals of the inverters 204, 206, 208, and 210.

In the embodiment, gate terminals of the NMOS transistors 212 and 213 are connected to the terminal W0. Similarly, gate terminals of the NMOS transistors 214 and 215 are connected to the terminal W1; gate terminals of the NMOS transistors 216 and 217 are connected to the terminal W2; and gate terminals of the NMOS transistors 218 and 219 are connected to the terminal W3.

In the embodiment, an output terminal of the inverter 205 is connected to the correction data output terminal QN0. Similarly, an output terminal of the inverter 207 is connected to the correction data output terminal QN1; an output terminal of the inverter 209 is connected to the correction data output terminal QN2; and an output terminal of the inverter 211 is connected to the correction data output terminal QN3.

Figure 5:
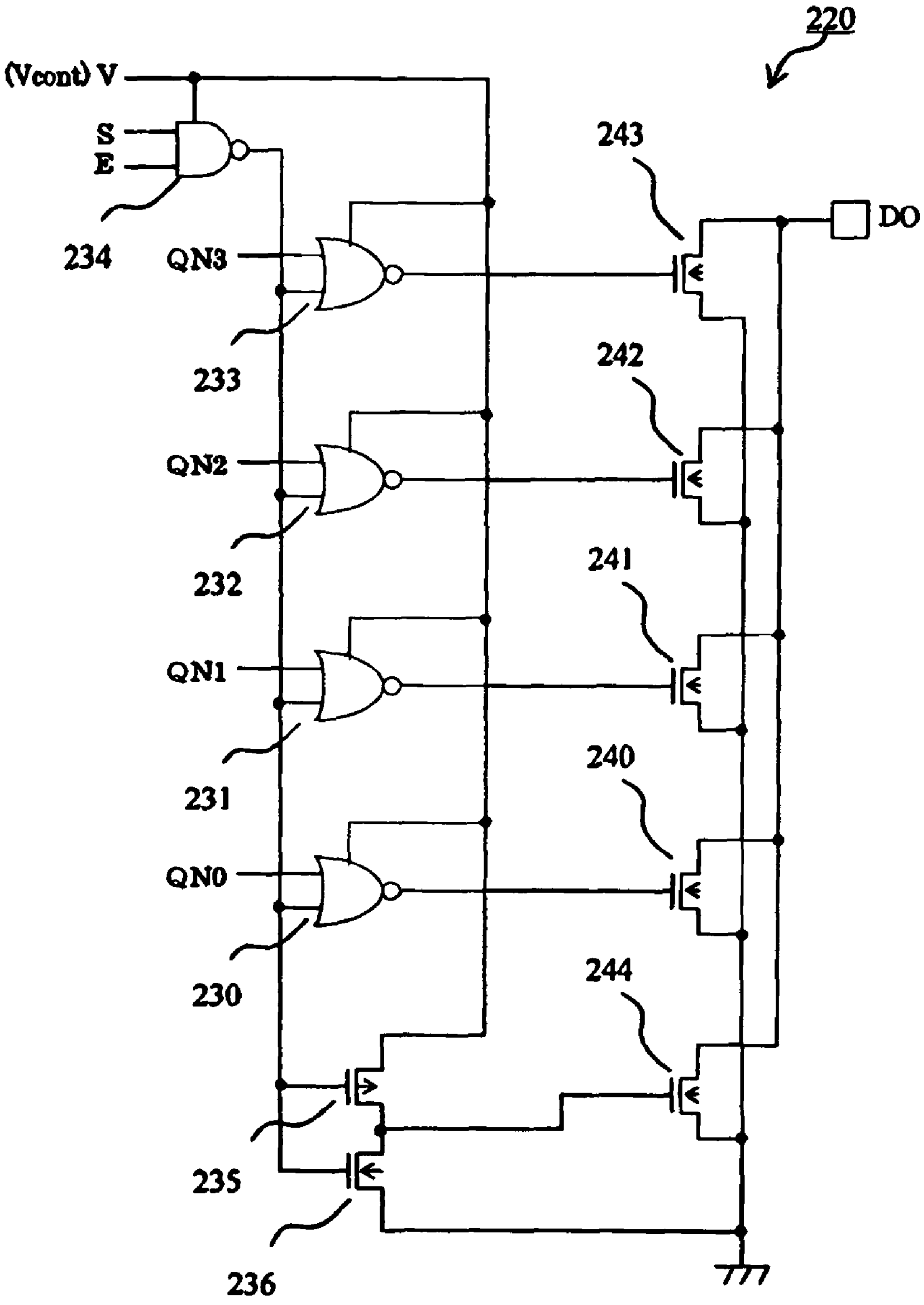
FIG. 5 is a circuit diagram showing a LED drive circuit according to the first embodiment of the present invention.

FIG. 5 is a circuit diagram showing the LED drive circuit 220 (DRV block) according to the first embodiment of the present invention.

As shown in FIG. 5, the LED drive circuit 220 includes NMOS transistors 240 to 244; an NMOS transistor 236; a PMOS transistor 235; NOR circuits 230 to 233; and an NAND circuit 234. Further, the LED drive circuit 220 includes a print data input terminal E; an input terminal S for directing on-off of an LED drive; a power source terminal V; correction data input terminals QN0 to QN3; and a drive current output terminal DO.

In the embodiment, the print data input terminal E of the LED drive circuit 220 is connected to a terminal Q of one of the latch circuit LTA1 to LTD1 to LTA48 to LTD48 shown in FIG. 2. The correction data input terminals QN0 to QN3 are connected to the correction data output terminals QN0 to QN3 of the memory circuit 200 shown in FIG. 4. The terminal S receives an on-off direction signal of the LED drive from the AND circuit 105 shown in FIG. 2. The terminal V receives a control voltage Vcont from the control voltage generation circuit 145 shown in FIG. 3. The drive current output terminal DO is connected to the cathode of the LED element.

In the embodiment, a power source of the NAND circuit 234 is connected to the terminal V, so that the control voltage Vcont is applied to the power source from the control voltage generation circuit 145 shown in FIG. 3. A ground portion of the NAND circuit 234 is connected to ground similar to source terminals of the NMOS transistors 240 to 244.

In the embodiment, power sources of the NMOS transistors 240 to 244 are connected to the terminal V, and ground portions of the NMOS transistors 240 to 244 are connected to ground similar to the source terminals thereof. As shown in the configuration of the LED head shown in FIG. 1, the anode terminals of the LED elements are connected to the power source VDD.

Figure 22:
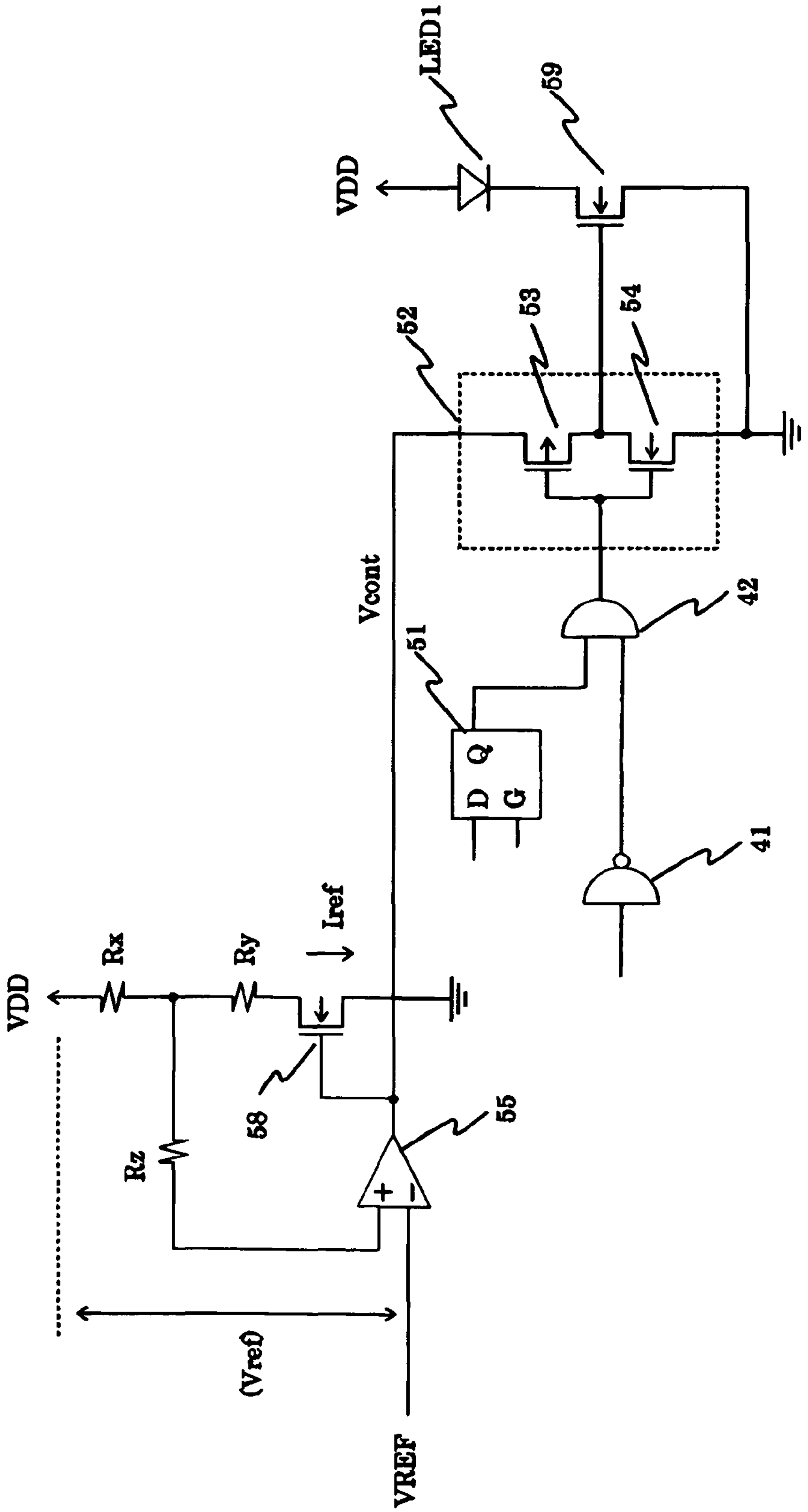
FIG. 22 CONVENTIONAL ART
FIG. 22 is another simplified circuit diagram showing the control voltage generation circuit of the conventional electro-photography printer.

The NMOS transistors 240 to 244 shown in FIG. 5 correspond to the drive transistor 59 of the conventional control voltage generation circuit shown in FIG. 22. Gate terminals of the NMOS transistors 240 to 243 are connected to output terminals of the NOR circuits 230 to 233, respectively. The source terminals of the NMOS transistors 240 to 244 are connected to ground. Drain terminals of the NMOS transistors 240 to 244 are connected to the drive current output terminal DO.

In the embodiment, the NMOS transistors 240 to 244 shown in FIG. 5 have a same gate length. The NMOS transistors 240 to 243 have gate widths in a ratio of 1:2:4:8, corresponding to bit weights of correction data output from the correction data output terminals QN0 to QN3 of the memory circuit 200.

An operation of the NOR circuits 230 to 233 and the likes will be explained next with reference to FIG. 5. First, data are shift-input to the shift registers FFA1 to FFD48 and the likes shown in FIG. 2 to turn on print data. Then, a LOAD-P signal is generated, and the print data are latched to the latch circuits LTA1 to LTD48 and the likes. When print dots are turned on at this moment, an input level of the terminal E of the corresponding LED drive circuit 220 becomes High.

When the on-off direction signal S of the LED drive becomes High for directing a drive-on, an output of the NAND circuit 234 becomes Low. At this moment, according to the terminal data of QN0 to QN3, output signals of the NOR circuits 230 to 233 and an output of the inverter formed of the PMOS transistor 235 and the NMOS transistor 236 become the Vcont potential or a ground potential.

In the embodiment, the NMOS transistor 244 is a main drive transistor for supplying a main drive current to the LED element LED1. The NMOS transistors 240 to 243 are auxiliary drive transistors for adjusting the drive current of the LED element LED1 to correct a light amount.

When the signal S is at the High level, the main drive transistor 244 is driven according to the print data signal (E). When the output of the NAND circuit 234 is at the Low level, the auxiliary drive transistors 240 to 243 are driven according to the outputs of QN0 to QN3 from the memory circuit 200. The memory circuit 200 stores correction data (described later) for correcting a variance in light emitting of the LED element. The outputs of QN0 to QN3 correspond to the correction data per LED dot.

In the embodiment, the outputs of QN0 to QN3 are four bits, so that the correction data per LED dot are also four bits. Accordingly, it is possible to adjust the drive current at 16 stages per LED dot. More specifically, the auxiliary drive transistors 240 to 243 are selectively driven together with the main drive transistor 244 according to the correction data. Accordingly, a drain current of the main drive transistor 244 is added to a drain current of the selected auxiliary drive transistor to obtain the drive current, and the drive current flows in from a side of the cathode of the LED element LED1 through the terminal DO.

When the NMOS transistors 240 to 243 are driven, an output of the inverter circuit formed of the NOR circuits 230 to 233, the PMOS transistor 235, and the NMOS transistor 236 becomes a High level (that is, the level is the potential of the terminal V, and is equal to the control voltage Vcont). Accordingly, a gate potential of the NMOS transistors 240 to 244 becomes substantially equal to the control voltage Vcont. As a result, it is possible to collectively adjust the drain current value of the NMOS transistor 240 to 244 according to the control voltage Vcont per driver IC.

Figure 6:
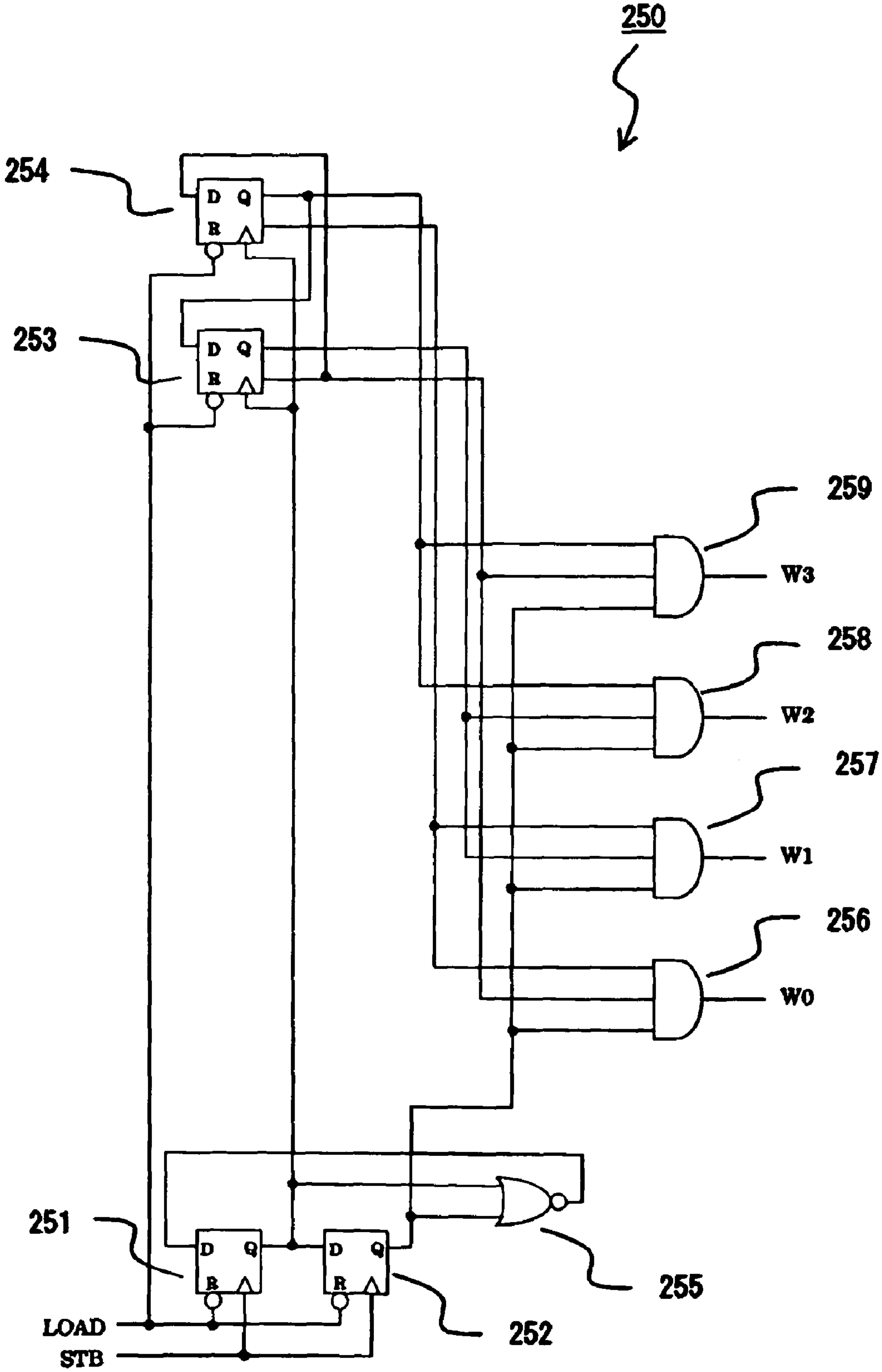
FIG. 6 is a circuit diagram showing a control circuit according to the first embodiment of the present invention.

FIG. 6 is a circuit diagram showing the control circuit 250 (CTRL) according to the first embodiment of the present invention.

As shown in FIG. 6, the control circuit 250 includes flip-flop circuits 251 to 254; an NOR circuit 255; and AND circuits 256 to 259 each having three input terminals. Further, the control circuit 250 includes an input terminal LOAD, a strobe terminal STB, and output terminals W0 to W3.

Figure 16:
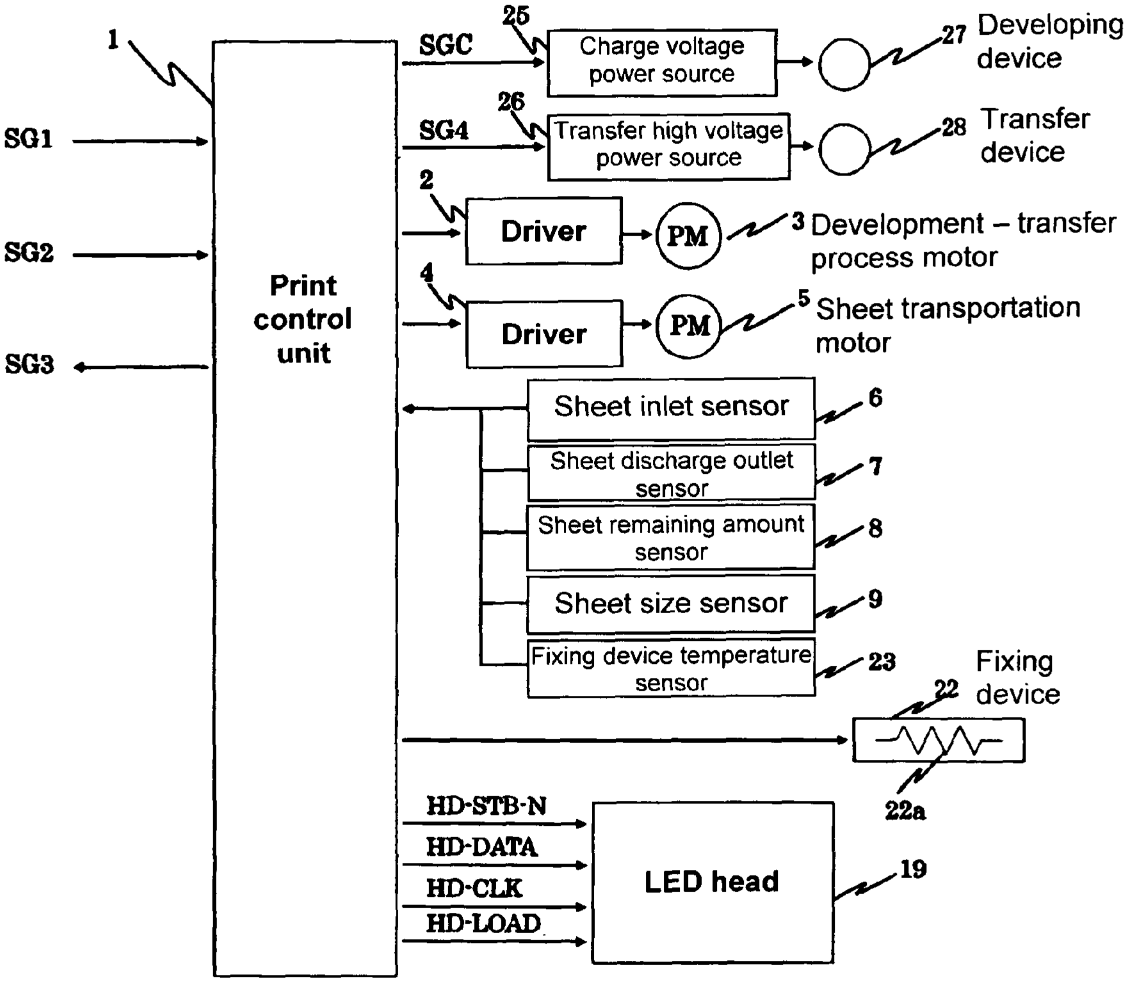
FIG. 16 CONVENTIONAL ART
FIG. 16 is a block diagram showing a printer control circuit of a conventional electro-photography printer.

In the embodiment, a strobe signal HD-STB-N of a negative logic is input to the strobe terminal STB of the driver IC from a print control unit 1 (refer to FIG. 16). Signals input to the other terminals are logically inverted with the inverter 103 (refer to FIG. 2), thereby generating a strobe signal STB-P of a positive logic. The strobe signal STB-P is input to the STB terminal of the control circuit 250. The strobe signal STB-P is also input to clock terminals of the flip-flop circuits 251 and 252 shown in FIG. 6.

In the embodiment, the LOAD-P signal (refer to FIG. 2) is input to the LOAD terminal of the control circuit 250, so that the LOAD-P signal is input to reset terminals of the flip-flop circuits 251 to 254. The terminal W0 of the control circuit 250 is connected to the terminal W0 of the memory circuit 200. Similarly, the terminals W1 to W3 of the control circuit 250 are connected to the terminals W1 to W3 of the memory circuit 200, respectively.

In the embodiment, the flip-flop circuits 251 and 252 and the NOR circuit 255 constitute a ring-counter circuit. The ring-counter circuit is reset when the latch signal LOAD-P is Low, and operates at an initial rise of the strobe signal STB-P from the inverter 103.

In the embodiment, a data input terminal D of the flip-flop circuit 251 is connected to an output terminal of the NOR circuit 255. A data output terminal Q of the flip-flop circuit 251 is connected to a data input terminal D of the flip-flop circuit 252. Two input terminals of the NOR circuit 255 are connected to data output terminals Q of the flip-flop circuits 251 and 252, respectively.

In the embodiment, the flip-flop circuits 253 and 254 constitute a Johnson-counter circuit. The Johnson-counter circuit is reset when the latch signal LOAD-P is Low, and operates at an initial rise of the output signal of the flip-flop circuit 251. A data input terminal D of the flip-flop circuit 254 is connected to an inverted data output terminal of the flip-flop circuit 253. A data input terminal D of the flip-flop circuit 253 is connected to a data output terminal Q of the flip-flop circuit 254.

In the embodiment, three input terminals of the AND circuit 256 are connected to inverted data output terminals of the flip-flop circuits 253 and 254, respectively. An output terminal of the AND circuit 256 is connected to the terminal W0 of the control circuit 250. Three input terminals of the AND circuit 257 are connected to the inverted data output terminal of the flip-flop circuit 254, a data output terminal of the flip-flop circuit 253, and a data output terminal of the flip-flop circuit 252, respectively. An output terminal of the AND circuit 257 is connected to the terminal W1 of the control circuit 250.

In the embodiment, three input terminals of the AND circuit 258 are connected to a data output terminal of the flip-flop circuit 254, the data output terminal of the flip-flop circuit 253, and the data output terminal of the flip-flop circuit 252, respectively. An output terminal of the AND circuit 258 is connected to the terminal W2 of the control circuit 250. Three input terminals of the AND circuit 259 are connected to the data output terminal of the flip-flop circuit 254, an inverted data output terminal of the flip-flop circuit 253, and the data output terminal of the flip-flop circuit 252, respectively. An output terminal of the AND circuit 259 is connected to the terminal W3 of the control circuit 250.

In the embodiment, the AND circuit 259 generates a writing control signal b3-WR with respect to a bit b3 of the correction data according to a count value of the two counters. Similarly, the AND circuits 258, 257, and 256 generates writing control signals b2-WR, b1-WR, and b0-WR with respect to bits b2, b1, and b0 of the correction data according to count values of the two counters, respectively.

Figure 7:
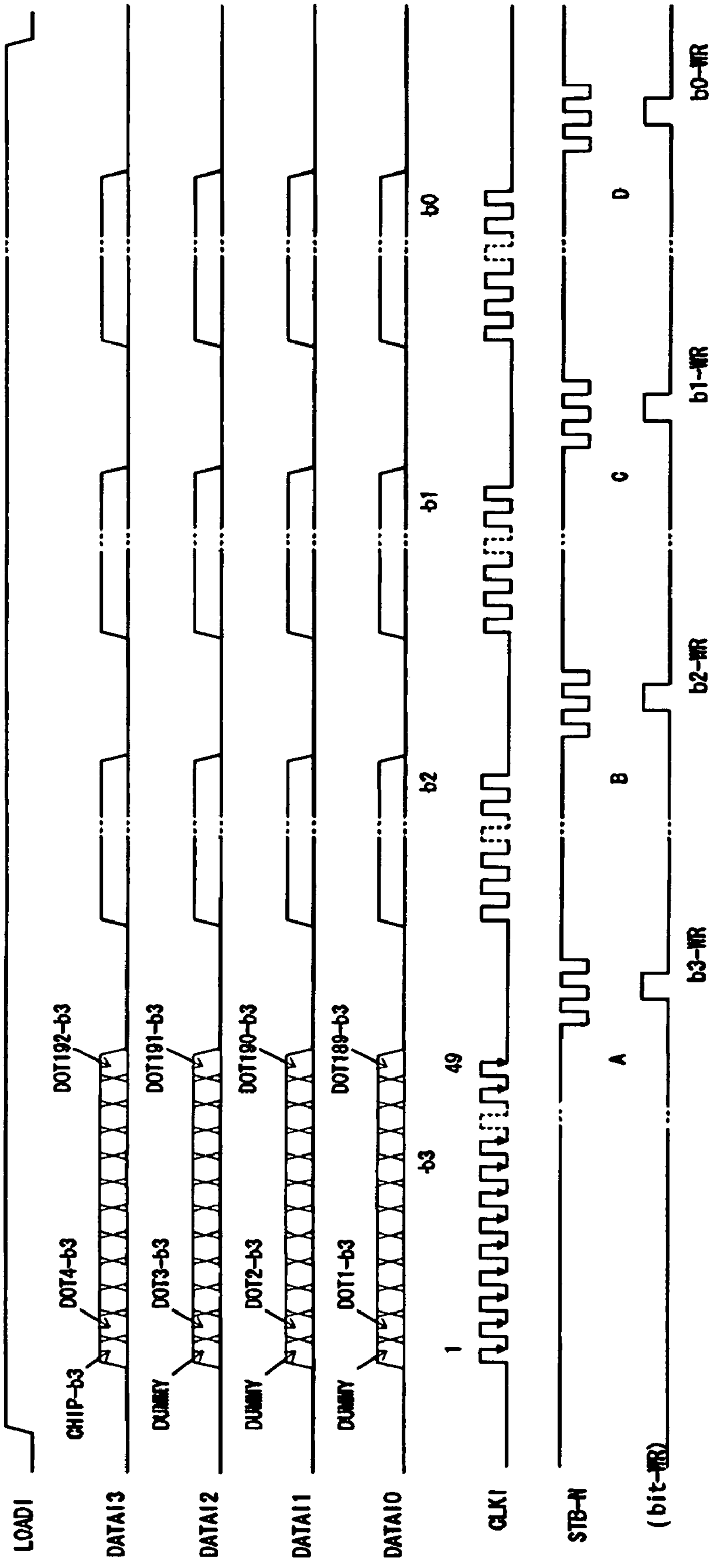
FIG. 7 is a time chart showing an operation of the driver IC according to the first embodiment of the present invention.
Figure 8:
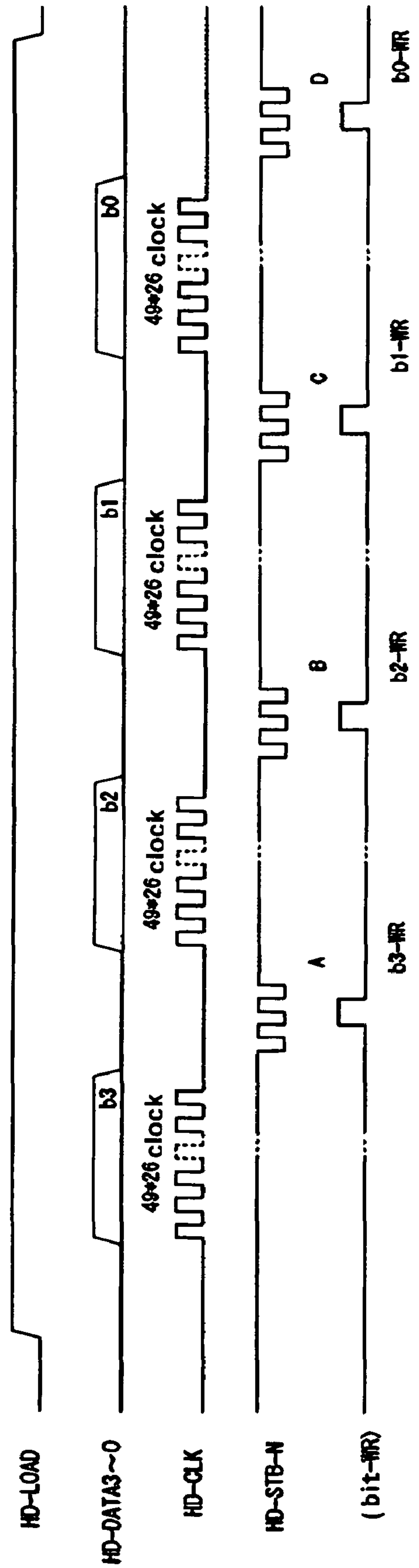
FIG. 8 is a time chart No. 2 showing an operation of the LED head according to the first embodiment of the present invention.

An operation according to the first embodiment will be explained next with reference to FIGS. 7 and 8. FIG. 7 is a time chart showing an operation of the driver IC according to the first embodiment of the present invention. FIG. 8 is a time chart No. 2 showing an operation of the LED head according to the first embodiment of the present invention.

In the operation of the driver IC shown in FIG. 7, the correction data are transmitted, and stored in the memory. In the operation of the LED head shown in FIG. 8, the correction data are transmitted, and stored in the memory. In the operation shown in FIG. 7, the driver ICs are connected in the 26-chip cascade arrangement.

As shown in FIG. 7, the correction data per chip are arranged as front data upon data transmission, so that the correction data per chip are sequentially transmitted. Chip correction data of bit 3 (shown as CHIP-b3 in FIG. 7) input to the data input terminal DATAI3 are shift-input at a first clock. Then, correction data of bit 3 of dot 1 (shown as DOT1-*b*3 in FIG. 7) input to the data input terminal DATAI0 are shift-input at a first clock.

Similarly, correction data of bit 3 of dot 1 (shown as DOT2-*b*3 in FIG. 7) input to the data input terminal DATAI1 are shift-input; correction data of bit 3 of dot 3 (shown as DOT3-*b*3 in FIG. 7) input to the data input terminal DATAI2 are shift-input; and correction data of bit 3 of dot 4 (shown as DOT4-*b*3 in FIG. 7) input to the data input terminal DATAI3 are shift-input.

In the next step, the shift-input is performed similarly. Correction data of bit 3 of dot 189 (shown as DOT189-*b*3 in FIG. 7) input to the data input terminal DATAI0 are shift-input at a 49-th clock. Similarly, correction data of bit 3 of dot 190 (shown as DOT190-*b*3 in FIG. 7) input to the data input terminal DATAI1 are shift-input; correction data of bit 3 of dot 191 (shown as DOT191-*b*3 in FIG. 7) input to the data input terminal DATAI2 are shift-input; and correction data of bit 3 of dot 192 (shown as DOT192-*b*3 in FIG. 7) input to the data input terminal DATAI3 are shift-input.

In the next step, among the correction data transmitted per chip as descried above, bit 3 data are written in an auxiliary memory cell at a portion A shown in FIG. 7; bit 2 data are written in an auxiliary memory cell at a portion B shown in FIG. 7; bit 1 data are written in an auxiliary memory cell at a portion C shown in FIG. 7; and bit 0 data are written in an auxiliary memory cell at a portion D shown in FIG. 7.

FIG. 8 is the time chart No. 2 showing the operation of the LED head according to the first embodiment of the present invention. In the operation shown in FIG. 8, the driver ICs are connected in the 26-chip cascade arrangement. In each of the IC drivers, the shift register is formed of the flip-flop circuits connected in 49 stages. Accordingly, it is possible to store data in an auxiliary memory cell through sequentially writing in the auxiliary memory cell after 26×49 clock pluses are sent per bit.

An operation of the control voltage generation circuit 145 will be explained. When the signals S0 to S3 to be transmitted to the control voltage generation circuit 145 shown in FIG. 3 change in 16 stages, the control voltage generation circuit 145 operates as follows.

In FIG. 3, when the PMOS transistors 110 to 113 have the gate width w0 to w3, respectively, and the PMOS transistor 114 has the gate width wm, the following relationships are established:

$$w1 = 2 \times w0$$

$$w2 = 4 \times w0$$

$$w3 = 8 \times w0$$

As well known in the art, a drain current Id of an MOS transistor operating in a saturated region is given by:

$$Id = K \times (W/L) \times (Vgs - Vt)^2$$

where K is a constant, W is a gate width, Vgs is a voltage between the gate and the source, and Vt is a threshold voltage.

As described above, the PMOS transistors 110 to 113 have the same gate length. When each of the PMOS transistors 110 to 113 is turned on, the PMOS transistors 110 to 113 have the same voltage between the gate and the source. Accordingly, the drain current of each of the PMOS transistors 110 to 113 is proportional to the gate width of each of the PMOS transistors 110 to 113.

When the PMOS transistors 110 to 113 are turned on, the drain currents Id0 to Id3 thereof have the following relationships:

$$Id1 = 2 \times Id0$$

$$Id2 = 4 \times Id0$$

$$Id3 = 8 \times Id0$$

It is assumed that a current Iref flows through the PMOS transistor 141, and a current Iref2 flows through the NMOS transistor 142.

When the signals S0 to S3 shown in FIG. 3 are '0000', the NMOS transistors 130 to 133 are turned off, and the PMOS transistors 120 to 123 are turned on. Accordingly, the PMOS transistors 110 to 113 have the gate potential substantially equal to VDD, and the PMOS transistors 110 to 113 are turned off.

The PMOS transistor 140 has the gate connected to the drain. Accordingly, it is assumed that the PMOS transistor 140 operates in the saturated region. Further, the PMOS transistor 141 has the gate potential equal to that of the PMOS transistor 140. Accordingly, it is assumed that the PMOS transistor 141 operates in the saturated region as well.

At this time, the current Iref2 flowing into the NMOS transistor 142 is equal to a drain current Idm of the PMOS transistor 140 (Iref2=Idm).

In the embodiment, the calculation amplifier 143 controls a potential of the output terminal thereof such that a potential of the non-inversion input terminal thereof becomes equal to a potential of the inversion input terminal thereof. Accordingly, a potential of the resistor Rref is equal to the VREF potential, and the current Iref of the PMOS transistor 141 is given by:

$$Iref = VREF/Rref$$

When the signals S0 to S3 shown in FIG. 3 are '0111', the NMOS transistor 133 is turned off, and the PMOS transistor 123 is turned on. Further, the NMOS transistors 130 to 132 are turned on, and the PMOS transistors 120 to 122 are turned off. Accordingly, the PMOS transistor 113 has the gate potential substantially equal to VDD, and the PMOS transistors 110 to 112 have the gate potential substantially equal to the gate potential of the PMOS transistor 140.

Accordingly, the PMOS transistors 110 to 112 operates in the saturated region, and the drain currents thereof are generated at the current ratio of 1:2:4. At this time, the current Iref2 flowing into the NMOS transistor 142 is equal to a sum of the drain current Idm of the PMOS transistor 140 and the currents of the PMOS transistors 110 to 112. Accordingly, the current Iref2 is given by:

$$Iref2=Idm+(4+2+1)\times Id0=Idm+7\times Id0$$

At this moment, the current Iref of the PMOS transistor 141 is given by:

$$Iref=VREF/Rref$$

Accordingly, when the PMOS transistors 140 and 110 have reduced gate widths such that the current Iref2 flowing through the NMOS transistor 142 becomes equal to the current Iref of the PMOS transistor 141, it is possible to set a target current value at the center of the chip correction. To this end, it is arranged such that the sum of the gate widths of the PMOS transistors 110 to 112, and 140 becomes equal to the gate width of the PMOS transistor 141.

When the signals S0 to S3 shown in FIG. 3 are '1111', the NMOS transistors 130 to 133 are turned on, and the PMOS transistors 120 to 123 are turned off. Accordingly, the PMOS transistors 110 to 113 have the gate potential substantially equal to the gate potential of the PMOS transistor 140. As a result, the PMOS transistors 110 to 113 operate in the saturated region, and the drain currents thereof are generated at the current ratio of 1:2:4:8.

At this time, the current Iref2 flowing into the NMOS transistor 142 is equal to a sum of the drain current Idm of the PMOS transistor 140 and the currents of the PMOS transistors 110 to 113. Accordingly, the current Iref2 is given by:

$$Iref2=Idm+(8+4+2+1)\times Id0=Idm+15\times Id0$$

The current Iref2 of the NMOS transistor 142 in an actual case will be explained according to specific values of the standard voltage VREF and the standard current Iref. The values in the following description are just examples, and may not be values for actual design.

It is assumed that the standard voltage VREF is 1.5 V, and the standard current Iref is 1.0 mA. Further, the drain current Iref2 of the NMOS transistor is 1.0 mA at the correction center shown in FIG. 20, and the current adjustment step is 3% according to the correction data.

In this case, the standard resistance Rref is given by:

$$Rref=Vref/Iref=1.5\text{ (V)}/1\text{ (mA)}=1.5\text{ K}\Omega$$

When the sum of the gate widths of the PMOS transistors 140, 110, 111, 112 is 100 μm, the gate width W0 of the PMOS transistor 110 is 3 μm according to the correction adjustment step of 3%. Accordingly, the gate width of each of the transistors is given by:

$$w1=2\times w0=6\ \mu\text{m}$$

$$w2=4\times w0=12\ \mu\text{m}$$

$$w3=8\times w0=24\ \mu\text{m}$$

Further, the gate width wm of the PMOS transistor 140 is given by:

$$wm=100-(12+6+3)=79\ \mu\text{m}$$

As apparent from the calculations described above, in the state that the chip correction data are set at the minimum, the drain current Iref2 of the NMOS transistor 142, which is equal to the drain current of the PMOS transistor 140, is given by:

$$Iref2=(wm/100)\times Iref=(79/100)\times 1\text{ mA}=0.79\text{ mA}$$

Accordingly, it is possible to obtain the low current value as the target value relative to the correction center point (−3%×7=−21%).

Further, in the state that the chip correction data are set at the center, the drain current Iref2 of the NMOS transistor 142 is given by:

$$Iref2=(100/100)\times 1\text{ mA}=1.0\text{ mA}$$

Accordingly, it is possible to obtain the current value at the target correction center.

Further, in the state that the chip correction data are set at the maximum, the drain current Iref2 of the NMOS transistor 142 is given by:

$$Iref2=((wm+w3+w2+w1+w0)/100)\times Iref=((79+24+12+6+3)/100)\times 1\text{ mA}=1.24\text{ mA}$$

Accordingly, it is possible to obtain the high current value as the target value relative to the correction center point (+3%×8=+24%).

As described above, with the control voltage generation circuit 145 shown in FIG. 3, it is possible to change the current flowing into the NMOS transistor 142 at 16 stages through the combination of the logic values of the signals S0 to S3 input to the control voltage generation circuit 145.

Figure 9:
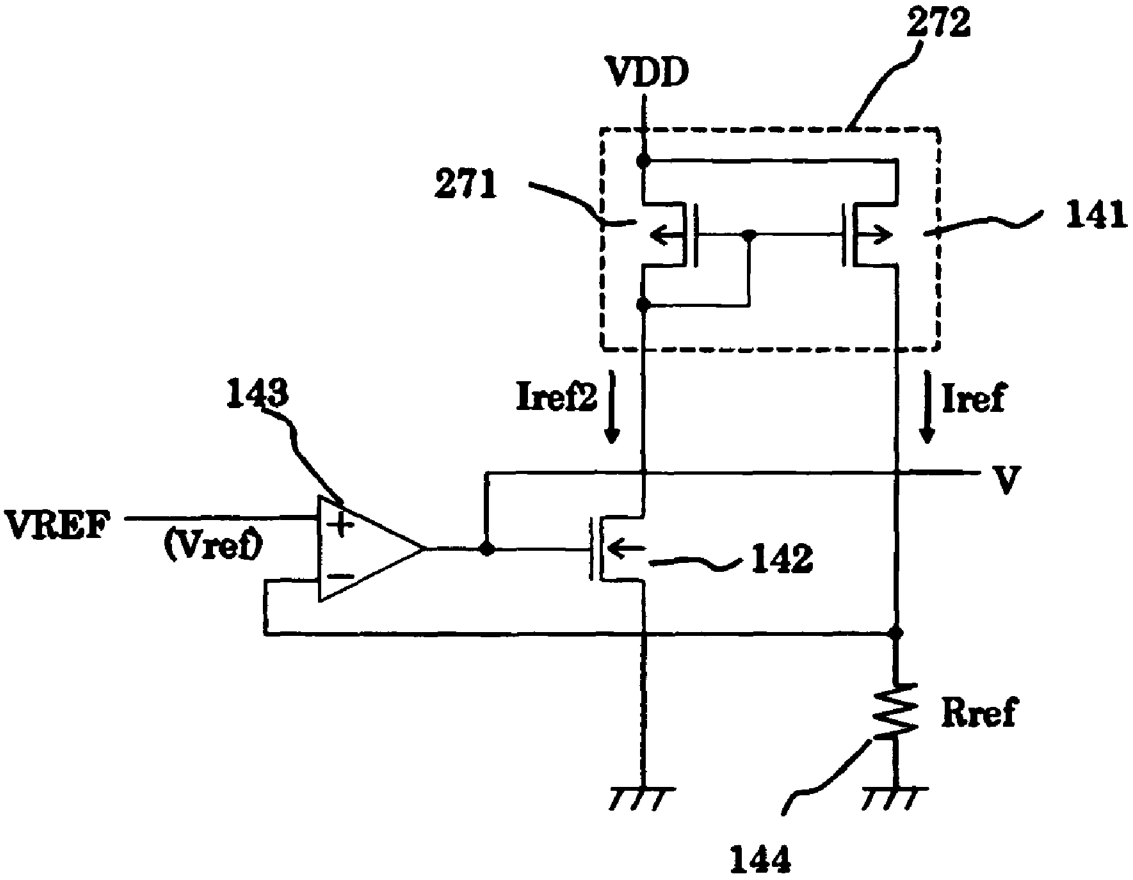
FIG. 9 is a simplified circuit diagram showing the control voltage generation circuit according to the first embodiment of the present invention.

An operation of the control voltage generation circuit 145 shown in FIG. 3 will be explained next. FIG. 9 is a simplified circuit diagram showing the control voltage generation circuit 145 according to the first embodiment of the present invention. Components shown in FIG. 9 corresponding to those in FIG. 3 are designated with the same reference numerals.

As shown in FIG. 9, a PMOS transistor 271 is a combined depiction of the PMOS transistors 140, 110 to 113 shown in FIG. 3. The PMOS transistor 271 has a gate terminal and a source terminal connected to the gate terminal and the source terminal of the PMOS transistor 141, respectively, thereby constituting a current mirror circuit 272. Further, the drain currents Iref and Iref2 of the PMOS transistors 141 and 271 are shown in FIG. 9.

It is assumed that the chip correction data are '0000' in the correction data minimum state in the table shown in FIG. 20. In this case, the PMOS transistors 110 to 113 shown in FIG. 3 are turned off, and the PMOS transistor 140 shown in FIG. 3 is turned on. Accordingly, the PMOS transistor 271 shown in FIG. 9 has a gate width same as the gate width wm of the PMOS transistor 140 shown in FIG. 3.

Further, it is assumed that the chip correction data are '0111' in the correction data center state in the table shown in FIG. 20. In this case, the PMOS transistor 113 shown in FIG. 3 is turned off, the PMOS transistors 110 to 112 shown in FIG. 3 are turned on, and the PMOS transistor 140 shown in FIG. 3 is turned on. Accordingly, the PMOS transistor 271 shown in FIG. 9 has the gate width calculated from the gate width wm of the PMOS transistor 140 and the gate width w0 of the PMOS transistor 110 shown in FIG. 3 as wm=(4+2+1)×w0.

Further, it is assumed that the chip correction data are '1111' in the correction data maximum state in the table shown in FIG. 20. In this case, the PMOS transistors 110 to 113 shown in FIG. 3 are turned on, and the PMOS transistor 140 shown in FIG. 3 is turned on. Accordingly, the PMOS transistor 271 shown in FIG. 9 has the gate width calculated from the gate width wm of the PMOS transistor 140 and the gate width w0 of the PMOS transistor 110 shown in FIG. 3 as wm=(8+4+2+1)×w0.

When the gate width of the PMOS transistor 141 is equal to the gate width of the PMOS transistor 271, and the correction data are set at the center, the drain current Iref2 of the PMOS transistor 271 is equal to the drain current Iref of the PMOS transistor 141. At this time, the voltage between the gate and the source of the NMOS transistor 142 is output as the potential Vcont to the LED drive circuit 220 shown in FIG. 5. Further, the NMOS transistors 240 to 244 shown in FIG. 5 in the current mirror relationship with the NMOS transistor 142 generate a current value proportional to the drain current Iref2 of the PMOS transistor 271, thereby driving the LED element (not shown).

When the correction data are set at the minimum, the gate width w0 of the PMOS transistor 271 becomes smaller than the gate width wm of the PMOS transistor 141 by −21%. Accordingly, the drain current Iref2 of the PMOS transistor 271 is given by:

$$Iref2=Iref\times(1-0.21)=0.79\times Iref$$

Accordingly, the NMOS transistors 240 to 244 shown in FIG. 5 generate a current value proportional to the drain current Iref2 of the PMOS transistor 271, thereby driving the LED element (not shown).

When the correction data are set at the maximum, the gate width w0 of the PMOS transistor 271 becomes greater than the gate width wm of the PMOS transistor 141 by +24%. Accordingly, the drain current Iref2 of the PMOS transistor 271 is given by:

$$Iref2=Iref\times(1+0.24)=1.24\times Iref$$

Accordingly, the NMOS transistors 240 to 244 shown in FIG. 5 generate a current value proportional to the drain current Iref2 of the PMOS transistor 271, thereby driving the LED element (not shown).

In the embodiment, it is possible to normally operate the control voltage generation circuit 145 even when the power source voltage is 3.3 V for the following reasons. It is assumed that the voltage between the gate and the source Vgs of the PMOS transistor 271 is 2 V (Vgs=2 V) even when the chip correction rate is set maximum. At the time, the voltage between the drain and the source Vds of the NMOS transistor 142 is given by:

$$Vds=VDD-Vgs$$

In order for the NMOS transistor 142 to operate in the saturated region, it is necessary to establish the following equation:

$$Vds\geqq Vgs-Vt$$

where Vt is the threshold voltage of the NMOS transistor. When the power source voltage is 5 V (VDD=5 V), the voltage between the drain and the source Vds of the NMOS transistor 142 is given by:

$$Vds=VDD-Vgs=5-2=3\ (V)$$

Accordingly, the voltage between the drain and the source Vds becomes greater than Vgs−Vt as follows:

$$Vgs-Vt=2.0-0.7=1.3\ (V)$$

Accordingly, the NMOS transistor 142 operates in the saturated region.

Similarly, when the power source voltage is 3.3 V, the voltage between the drain and the source Vds of the NMOS transistor 142 is given by:

$$Vds=VDD-Vgs=3.3-2=1.3\ (V)$$

Accordingly, the voltage between the drain and the source Vds becomes equal to Vgs−Vt as follows:

$$Vgs-Vt=2.0-0.7=1.3\ (V)$$

Accordingly, when the power source voltage is 3.3 V, the NMOS transistor 142 operates in the saturated region, so that it is possible to normally operate the control voltage generation circuit 145 shown in FIG. 9.

Figure 10:
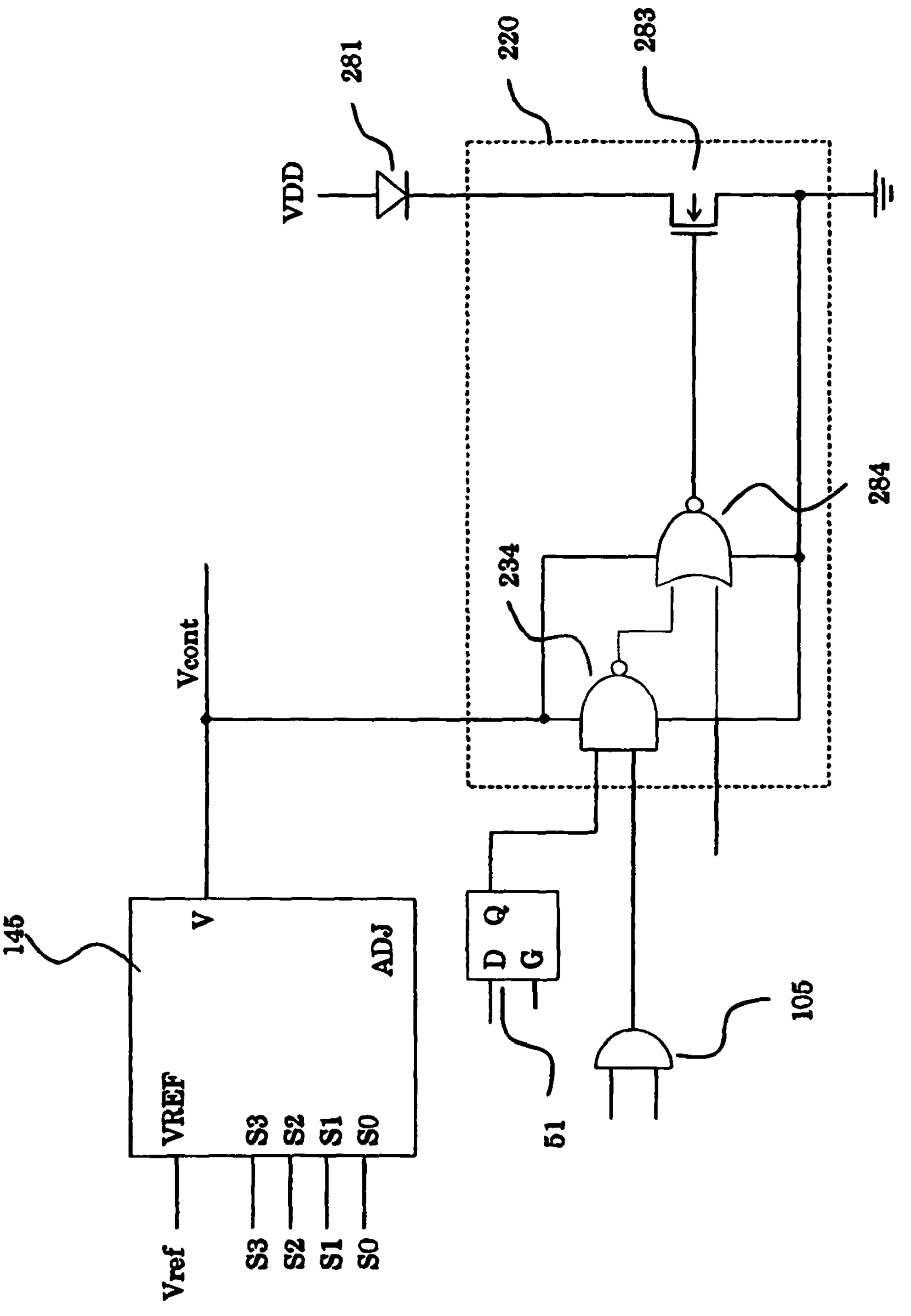
FIG. 10 is a simplified circuit diagram showing the LED drive circuit according to the first embodiment of the present invention.

FIG. 10 is a simplified circuit diagram showing the LED drive circuit according to the first embodiment of the present invention. Components shown in FIG. 10 corresponding to those in FIGS. 3 and 5 are designated with the same reference numerals.

As shown in FIG. 10, an LED element 281 is a combined depiction of the LED elements LED1 to LED4992 shown in FIG. 1. Similarly, the LED drive circuit 220 is a simplified depiction of the LED drive circuit 220 shown in FIG. 5. An NOR circuit 284 is a combined depiction of the NOR circuits 230 to 233 shown in FIG. 5. The AND drive circuit 105 is a simplified depiction of the AND circuit 105 shown in FIG. 5. The control voltage generation circuit 145 is a simplified depiction of the control voltage generation circuit 145 shown in FIG. 3.

As explained with reference to FIG. 3, with the control voltage generation circuit 145 shown in FIG. 10, it is possible to change the voltage Vcont output from the terminal V at 16 stages according to 16 direction values of the signals S0 to S3. The voltage Vcont is applied to the power sources of the NAND circuit 234 and the NOR circuit 284, so that the voltage Vcont becomes the voltage between the gate and the source when the NMOS transistor 283 is turned on.

The NMOS transistor 142 and the NMOS transistor 283 shown in FIG. 9 have the current mirror relationship. Accordingly, when it is possible to change the drain current Iref2 of the NMOS transistor 142 at 16 stages, it is possible to change the drain current of the NMOS transistor 283 at 16 stages.

In the embodiment, the drain current of the NMOS transistor 283 becomes the drive current of the LED element 281. Accordingly, through adjusting the drain current of the NMOS transistor 283, it is possible to change the drive current of the LED element 281 at 16 stages, thereby making it possible to correct a variance in light emitting power of the LED element 281.

As described above, in the embodiment, the drive circuit provides the following effects. With the recent advancement in the semiconductor manufacturing process technology, a size of an MOS transistor has been drastically reduced. As a result, a withstand voltage of the MOS transistor tends to decrease, thereby making it necessary to decrease a power voltage of an IC including the MOS transistor.

For example, a conventional standard power voltage of 5 V has decreased to 3.3 V to 2.5 V. As apparent from the trend, it is necessary to decrease the power voltage with decreasing the size of the MOS transistor.

In the conventional technology, when the power voltage is 5 V, the circuit can be operated normally. However, when the power voltage is 3.3 V, it is difficult to operate the circuit. It has been required to provide a circuit capable of operating at the power voltage of 3.3 V, lower than the conventional standard power voltage.

In the embodiment, it is possible to operate the circuit even when the power voltage is 3.3 V. Accordingly, it is possible to produce the driver IC using a CMOS manufacturing process with a reduced size, thereby reducing a size of the chip.

Further, in the LED head of the embodiment, it is possible to reduce power consumption of the river IC through reducing the power voltage. Accordingly, it is possible to prevent a problem in which a dot position of each LED head due to thermal expansion caused by heat of the LED head and a temperature increase associated therewith, thereby obtaining synergy effect.

Figure 19:
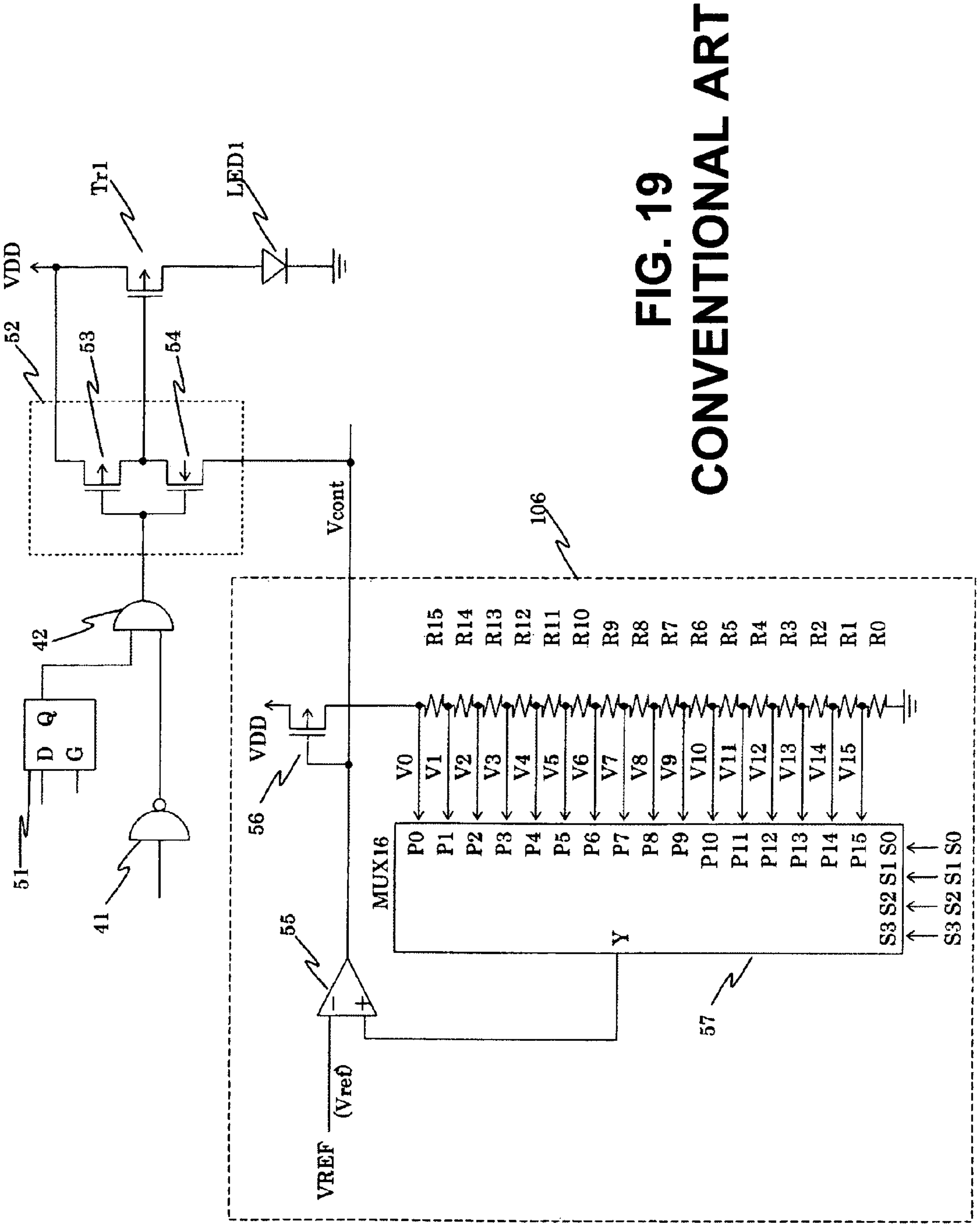
FIG. 19 CONVENTIONAL ART
FIG. 19 is a circuit diagram showing a control voltage generation circuit of the conventional electro-photography printer.

Further, in the embodiment, as opposed to the conventional configuration in which 16 resistor elements (R0 to R16 shown in FIG. 19) are arranged, one resistor 144 is disposed as shown in FIG. 3. Accordingly, it is possible to reduce the chip area occupied by the resistor element, thereby reducing manufacturing cost.

Second Embodiment

Figure 11:
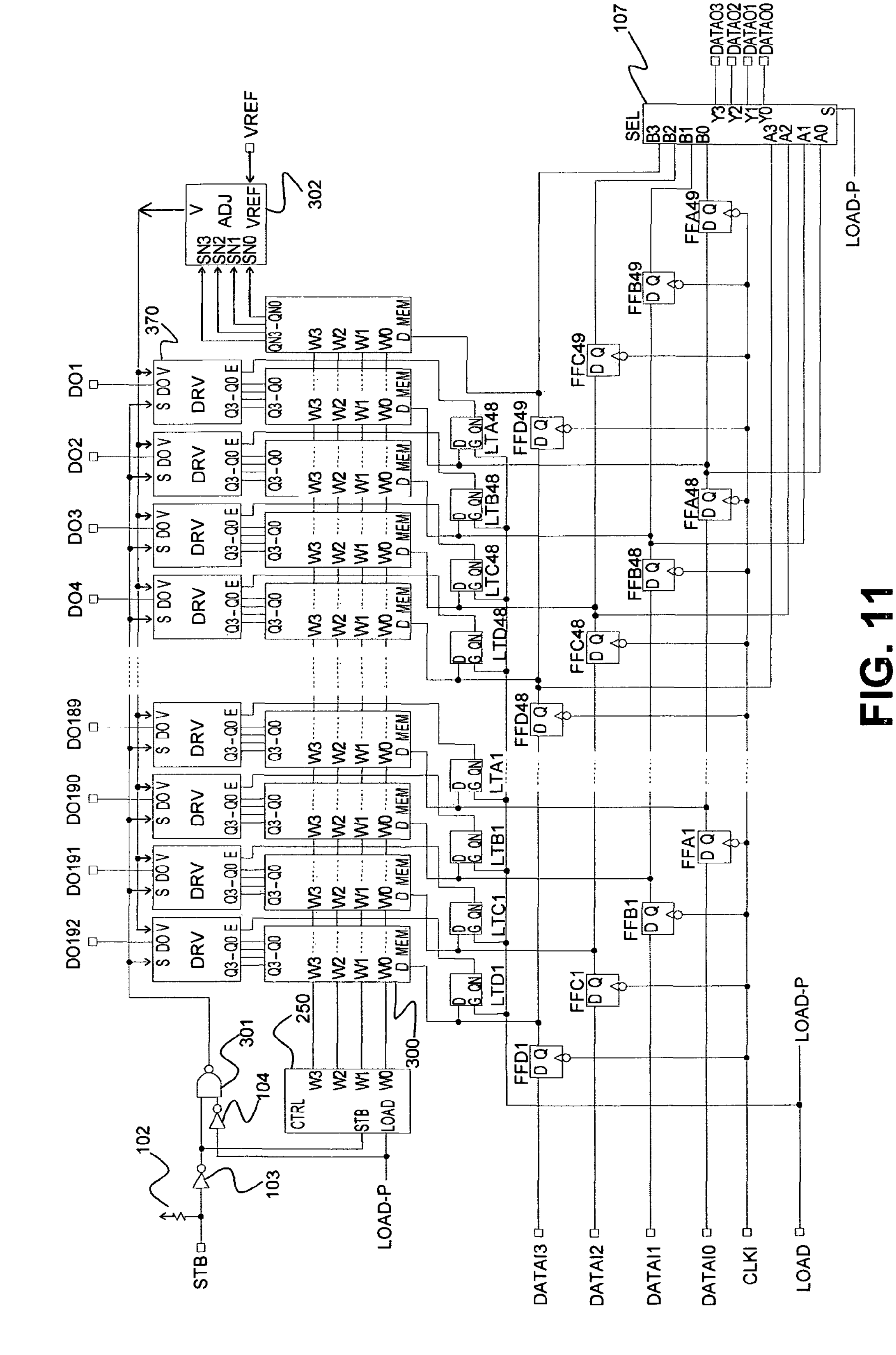
FIG. 11 is a block diagram showing a configuration of a driver IC according to a second embodiment of the present invention.

A second embodiment of the present invention will be explained next. FIG. 11 is a block diagram showing a configuration of a driver IC according to the second embodiment of the present invention. The driver IC is provided for driving an LED array (not shown). Accordingly, the driver IC supplies a drive current to an anode terminal of an LED element (not shown), so that the drive current flows to ground through a cathode terminal of the LED element, thereby emitting light.

Similar to the first embodiment, the shift register 44 is formed of flip-flop circuits FFA1 to FFA49, FFB1 to FFB49, FFC1 to FFC49, and FFD1 to FFD49 shown in FIG. 11. Further, corresponding to the latch circuit 43 in the first embodiment, the latch circuits LTA1 to LTD1, to LTS49 to LTD49 are provided. The control circuit 250 (CTRL) has a configuration similar to that in the first embodiment.

As shown in FIG. 11, the IC driver includes memory circuits 300 (described later) and LED drive circuits 370 (described later). Further, the IC driver includes the resistor 102; the inverter circuits 103 and 104; an NAND circuit 301; and the selector circuit 107. The resistor 102 is connected between the terminal STB for receiving a strobe signal of the negative logic and the power source VDD.

In the embodiment, the selector circuit 107 has the input terminals A0 to A3 and B0 to B3, the output terminal Y0 to Y3, and the selection input terminal S of the data terminal. When the selection input terminal S is Low, input data to the input terminals A0 to A3 are output from the output terminals Y0 to Y3. When the selection input terminal S is High, input data to the input terminals B0 to B3 are output from the output terminals Y0 to Y3.

As shown in FIG. 11, the IC driver further includes a control voltage generation circuit 302 (indicated as ADJ block, described later). The control voltage generation circuit 302 has data input terminals SN0 to SN3 and the standard voltage input terminal VREF. The standard voltage input terminal VREF is connected to the standard voltage generation circuit 46 shown in FIG. 1, so that the specific voltage Vref with the ground potential as standard is applied to the standard voltage input terminal VREF.

In the embodiment, the control voltage generation circuit 302 further has the output terminal V for outputting the control voltage Vcont to the LED drive circuits 370 disposed in the number of 192. The data input terminals SN0 to SN3 are connected to terminals QN0 to QN3 of the MEM circuit 300, so that chip correction data stored in the MEM circuit 300 are input to the data input terminals SN0 to SN3.

The flip-flop circuits FFA1 to FFA49 are connected in a cascade arrangement. The data input terminal D of the flip-flop circuit FFA1 is connected to the data input terminal DATAI0 of the driver IC. Further, the flip-flop circuits FFA48 and FFA49 output data to the selector circuit 107, and the output terminal Y0 of the selector circuit 107 is connected to the data output terminal DATAO0 of the driver IC.

Similarly, the flip-flop circuits FFB1 to FFB49, FFC1 to FFC49, and FFD1 to FFD49 are connected in a cascade arrangement, respectively. The data input terminals D of the flip-flop circuit FFB1, FFC1, and FFD1 are connected to the data input terminals DATAI1, DATAI2, and DATAI3 of the driver IC, respectively. Further, the flip-flop circuits FFB48 and FFB49, FFC48 and FFC49, and FFD48 and FFD49 output data to the selector circuit 107. The output terminals Y1, Y2, and Y3 of the selector circuit 107 are connected to the data output terminals DATAO1, DATAO2, and DATAO3 of the driver IC, respectively.

With the configuration described above, the flip-flop circuits FFA1 to FFA49, FFB1 to FFB49, FFC1 to FFC49, and FFD1 to FFD49 constitute the shift register circuits with 49 stages, respectively. Accordingly, with the selector circuit 107, it is possible to switch a shift stage between the 48-stage and the 49-stage. The clock terminals of the flip-flop circuits FFA1 to FFA49, FFB1 to FFB49, FFC1 to FFC49, and FFD1 to FFD49 are connected to the clock terminal HD-CLK of the LED head, thereby performing a shift operation synchronizing with the clock signal.

The data output terminals DATAO0 to DATAO3 of the driver IC are connected to the data input terminals DATAI0 to DATAI3 of the driver IC in a next stage, respectively. Accordingly, the flip-flop circuits FFA1 to FFA49 of the driver ICs IC1 to IC26 constitute the shift register circuits with the 48×26 stages or the 49×26 stages for shifting the data signal HD-DATA0 input from the print control unit 1 (refer to FIG. 16) to the driver IC IC26, i.e., the driver IC at the first stage, synchronizing with the clock signal.

Similarly, the flip-flop circuits FFB1 to FFB49, FFC1 to FFC49, and FFD1 to FFD49 of the driver ICs IC1 to IC26 constitute the shift register circuits with the 48×26 stages or the 49×26 stages, respectively, for shifting the data signals HD-DATA1, HD-DATA2, and HD-DATA3 input from the print control unit 1 to the driver IC IC26, i.e., the driver IC at the first stage, synchronizing with the clock signal, respectively.

The latch circuits LTA1 to LTA48, LTB1 to LTB48, LTC1 to LTC48, and LTD1 to LTD48 operate according to the latch signal LOAD-P input to the HD-LOAD terminal of the LED head. The latch circuits LTA1 to LTA48 latch the data signal HD-DATA0 stored in the flip-flop circuits FFA1 to FFA49. Similarly, the latch circuits LTB1 to LTB48, LTC1 to LTC48, and LTD1 to LTD48 latch the data signals HD-DATA1, HD-DATA2, and HD-DATA3 stored in the flip-flop circuits FFB1 to FFB49, FFC1 to FFC49, and FFD1 to FFD49, respectively.

One input terminal of the NAND circuit 301 is connected to the terminal STB of the driver IC through the inverter 103, and is connected to the strobe signal input terminal HD-STB-N of the LED head. The other input terminal of the NAND circuit 301 is connected to the terminal LOAD of the driver IC through the inverter 104, so that the latch signal input to the load signal input terminal HD-LOAD of the LED head is input to the other input terminal.

An output terminal of the NAND circuit 301 is connected to drive on-off terminals S of the LED drive circuits 370. When the load signal input terminal signal of the LED head is Low (the LOAD-P signal is Low), and the strobe signal input terminal HD-STB-N is at a Low level, an output of the NAND circuit 301 becomes High, so that the NAND circuit 301 generates a signal for controlling on-off of the drive of the LED drive circuits 370 according to the LOAD-P.

Figure 12:
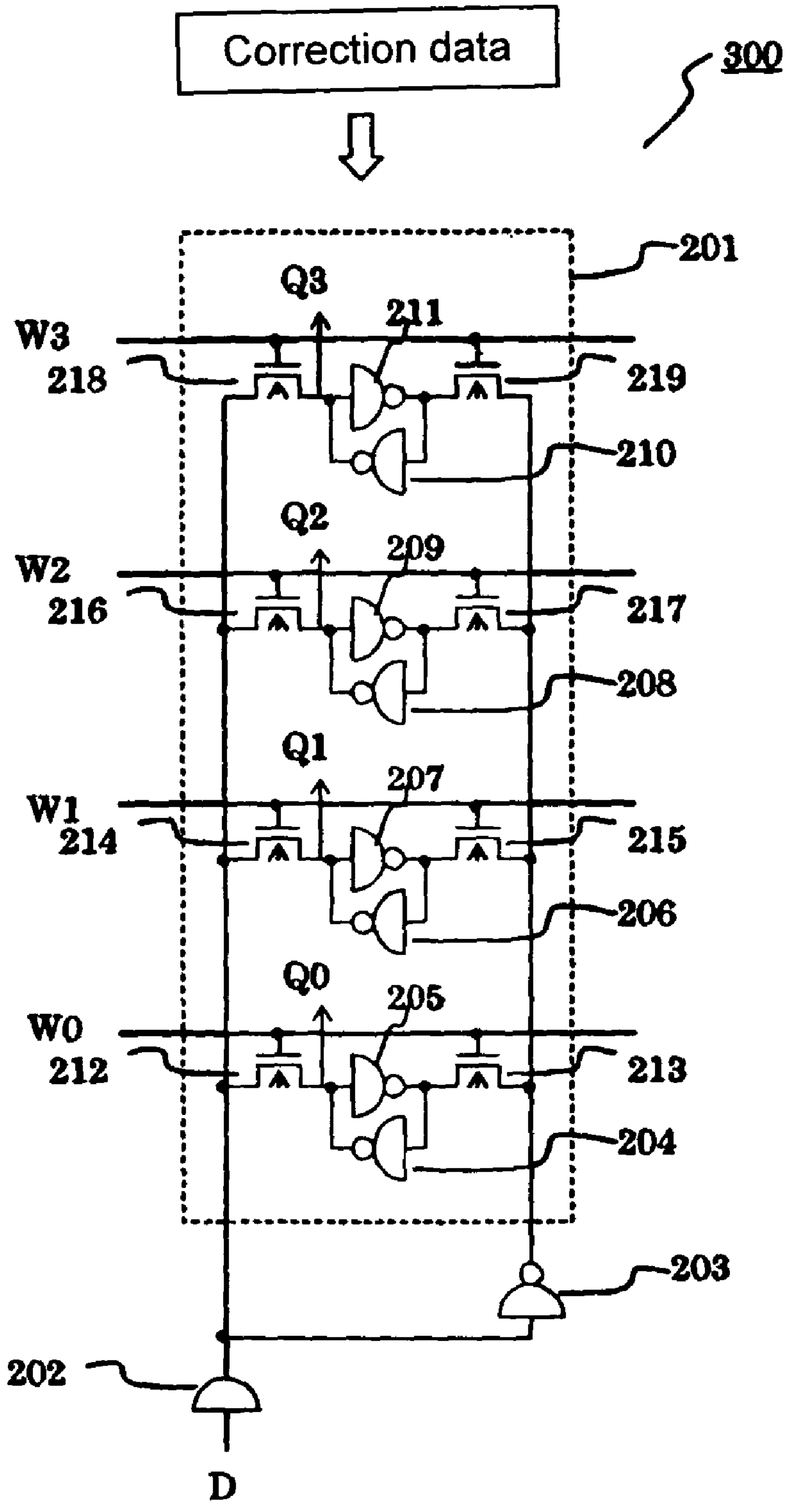
FIG. 12 is a circuit diagram showing a memory circuit according to the second embodiment of the present invention.

FIG. 12 is a circuit diagram showing the memory circuit 300 according to the second embodiment of the present invention.

As shown in FIG. 12, the memory circuit 300 includes the memory cell circuit 201 (indicated by a hidden line); the buffer circuit 202; and the inverter 203. Further, the memory circuit 300 includes the correction data input terminal D; the memory cell selection terminals W0 to W3; and the data output terminals Q0 to Q3. The memory cell circuit 201 is formed of the inverters 204 to 211 and the NMOS transistors 212 to 219.

As shown in FIG. 12, the buffer circuit 202 has the correction data input terminal D as the input terminal thereof. The output terminal of the buffer circuit 202 is connected to the input terminal of the inverter 203, and is further connected to the first terminals of the NMOS transistors 212, 214, 216, and 218. The output terminal of the inverter 203 is connected to the first terminals of the NMOS transistors 213, 215, 217, and 219.

In the embodiment, the inverter 204 is connected to the inverter 205 in series. Similarly, the inverter 206 is connected to the inverter 207 in series; the inverter 208 is connected to the inverter 209 in series; and the inverter 210 is connected to the inverter 211 in series, thereby constituting the memory cell circuit 201.

In the embodiment, the second terminals of the NMOS transistors 212, 214, 216, and 218 are connected to the input terminals of the inverters 205, 207, 209, and 211. The second terminals of the NMOS transistors 213, 215, 217, and 219 are connected to the input terminals of the inverters 204, 206, 208, and 210.

In the embodiment, the gate terminals of the NMOS transistors 212 and 213 are connected to the terminal W0. Similarly, the gate terminals of the NMOS transistors 214 and 215 are connected to the terminal W1; the gate terminals of the NMOS transistors 216 and 217 are connected to the terminal W2; and the gate terminals of the NMOS transistors 218 and 219 are connected to the terminal W3.

In the embodiment, the output terminal of the inverter 204 is connected to the data output terminal Q0. Similarly, the output terminal of the inverter 206 is connected to the data output terminal Q1; the output terminal of the inverter 208 is connected to the data output terminal Q2; and the output terminal of the inverter 210 is connected to the data output terminal Q3.

Figure 13:
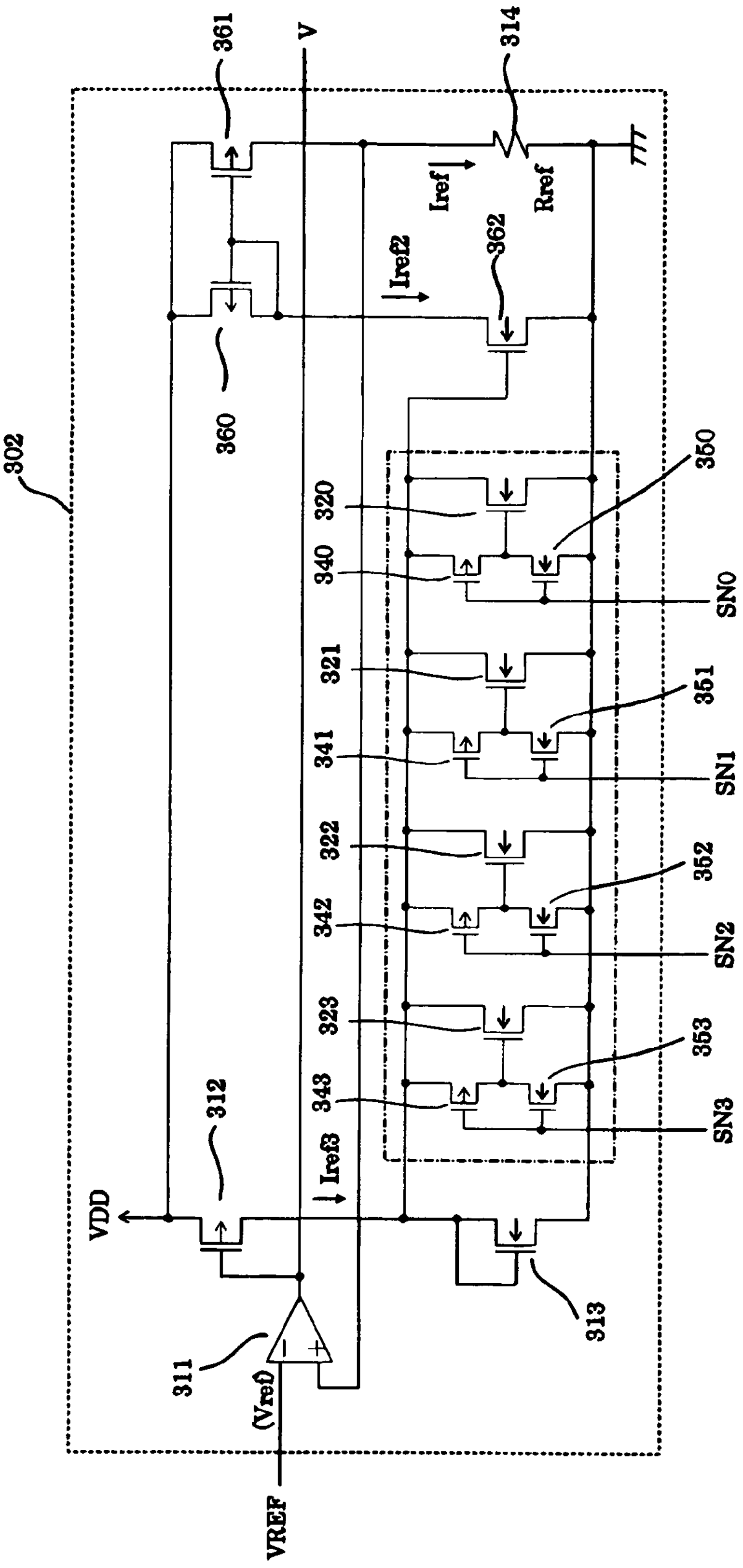
FIG. 13 is a circuit diagram showing a control voltage generation circuit according to the second embodiment of the present invention.

FIG. 13 is a circuit diagram showing the control voltage generation circuit 302 according to the second embodiment of the present invention. As shown in FIG. 13, the control voltage generation circuit 302 includes PMOS transistors 340 to 343, 312, 360, and 361; NMOS transistors 350 to 353, 313, and 362; a calculation amplifier 311; and a resistor 314 (Rref).

In the embodiment, sources of the PMOS transistors 312, 360, and 361 are connected to the power source VDD. Drains of the PMOS transistors 340 to 343 are connected to drains of the NMOS transistors 350 to 353, respectively. Gates of the PMOS transistors 340 to 343 are connected to gates of the NMOS transistors 350 to 353, respectively, and are further connected to the terminals SN0, SN1, SN2, and SN3, respectively.

In the embodiment, the PMOS transistor 340 and the NMOS transistor 350 constitute an inverter circuit. Similarly, the PMOS transistor 341 and the NMOS transistor 351 constitute an inverter circuit; the PMOS transistor 342 and the NMOS transistor 352 constitute an inverter circuit; and the PMOS transistor 343 and the NMOS transistor 353 constitute an inverter circuit.

In the embodiment, gates of the NMOS transistors 320 to 323 are connected to drains of the PMOS transistors 340 to 343, respectively. A source of the NMOS transistors 313 is connected to ground. A drain of the PMOS transistor 312, sources of the PMOS transistors 340 to 343, drains of the NMOS transistors 320 to 323, and a gate of the NMOS transistor 362 are connected each other. The sources of the NMOS transistors 350 to 353, the sources of the NMOS transistors 330 to 333, and the source of the NMOS transistor 362 are connected to ground.

In the embodiment, the gates of the PMOS transistors 360 and 361 are connected to each other, and are further connected to the gate of the PMOS transistor 360 and the drain of the NMOS transistor 362. The drain of the PMOS transistor 361 is connected to one end portion of the resistor 314, and the other end portion of the resistor 314 is connected to ground.

In the embodiment, an inversion input terminal of the calculation amplifier 311 is connected to the input terminal VREF of the standard voltage, and a non-inversion input terminal of the calculation amplifier 311 is connected to the drain of the PMOS transistor 361. An output terminal of the calculation amplifier 311 is connected to the gate of the PMOS transistor 312, and an output terminal V thereof.

In the embodiment, the PMOS transistors 320 to 323, 313, and 362 have a same gate length. The PMOS transistor 320 to 323 have gate widths in a ratio of 1:2:4:8. Further, the PMOS transistor 360 and the NMOS transistor 361 have a same gate length, and are connected with each other to have a common source potential and a common gate potential, thereby establishing the current mirror relationship.

Figure 14:
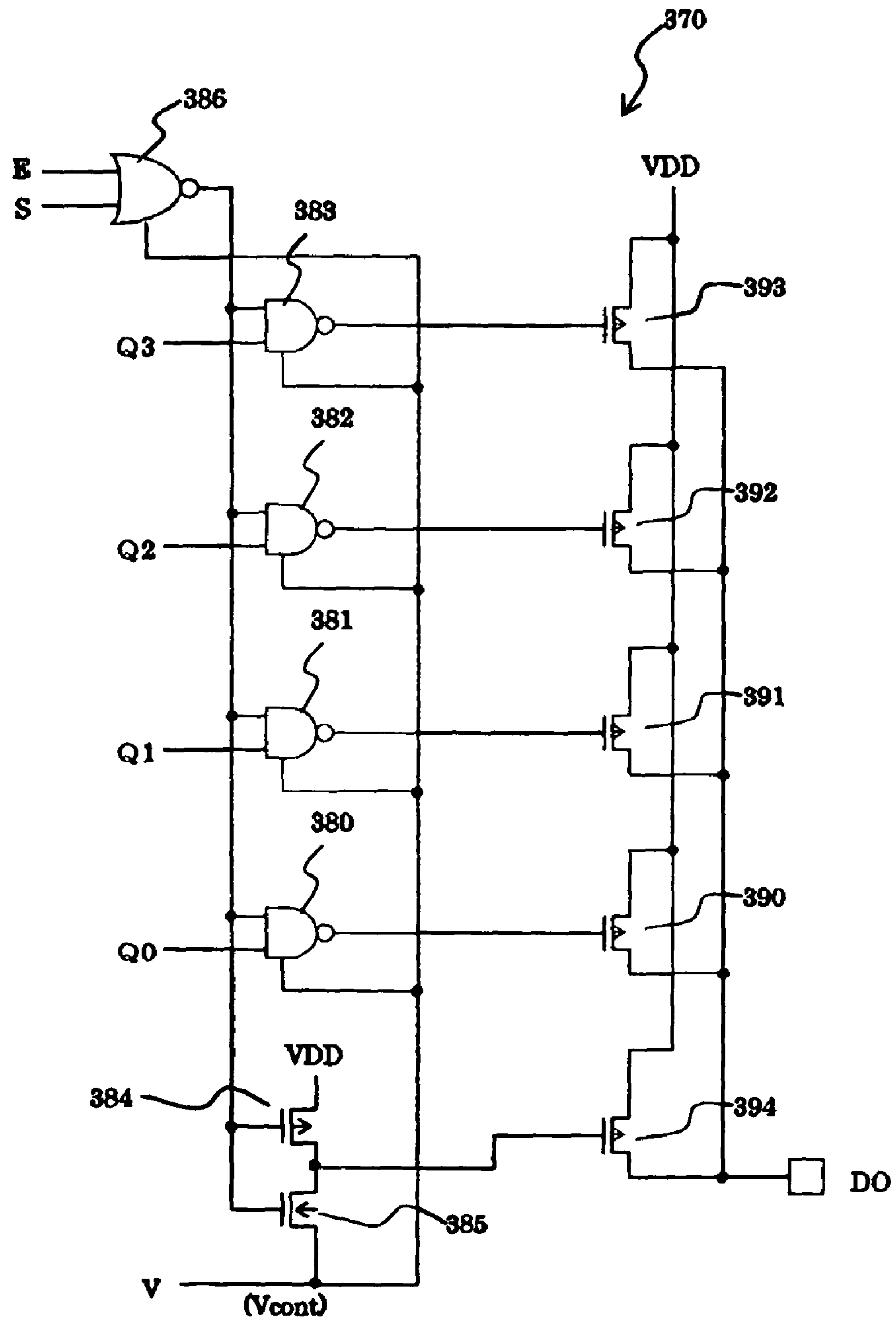
FIG. 14 is a circuit diagram showing a LED drive circuit according to the second embodiment of the present invention.

FIG. 14 is a circuit diagram showing the LED drive circuit 370 according to the second embodiment of the present invention.

As shown in FIG. 14, the LED drive circuit 370 includes PMOS transistors 390 to 394; a PMOS transistor 384; an PMOS transistor 385; NAND circuits 380 to 383; and an NOR circuit 386. Further, the LED drive circuit 370 includes the print data input terminal E (the negative logic); the input terminal S (the negative logic) for directing on-off of an LED drive; the input terminal V; the correction data input terminals Q0 to Q3; and the drive current output terminal DO.

In the embodiment, the print data input terminal E of the LED drive circuit 370 is connected to the QN terminal of one of the latch circuit LTA1 to LTD1 to LTA48 to LTD48 shown in FIG. 11. The correction data input terminals Q0 to Q3 are connected to the correction data output terminals Q0 to Q3 of the memory circuit 300 shown in FIG. 12. The terminal S receives an on-off direction signal of the LED drive from the NAND circuit 301 shown in FIG. 11. The terminal V is connected to the terminal V of the control voltage generation circuit 302 shown in FIG. 11, so that the terminal V receives a control voltage Vcont from the control voltage generation circuit 302. The drive current output terminal DO is connected to the cathode of the LED element.

In the embodiment, power sources of the NOR circuit 386, and the NAND circuits 380 to 383 are connected to the power source VDD. Similarly, sources of the PMOS transistors 390 to 394, and 384 are connected to the power source VDD. Ground portions of the NOR circuit 386, and the NAND circuits 380 to 383, and a source of the NMOD transistor 385 are connected to the terminal V, so that the control voltage Vcont output from the control voltage generation circuit 302 shown in FIG. 11 is applied thereto.

Figure 21:
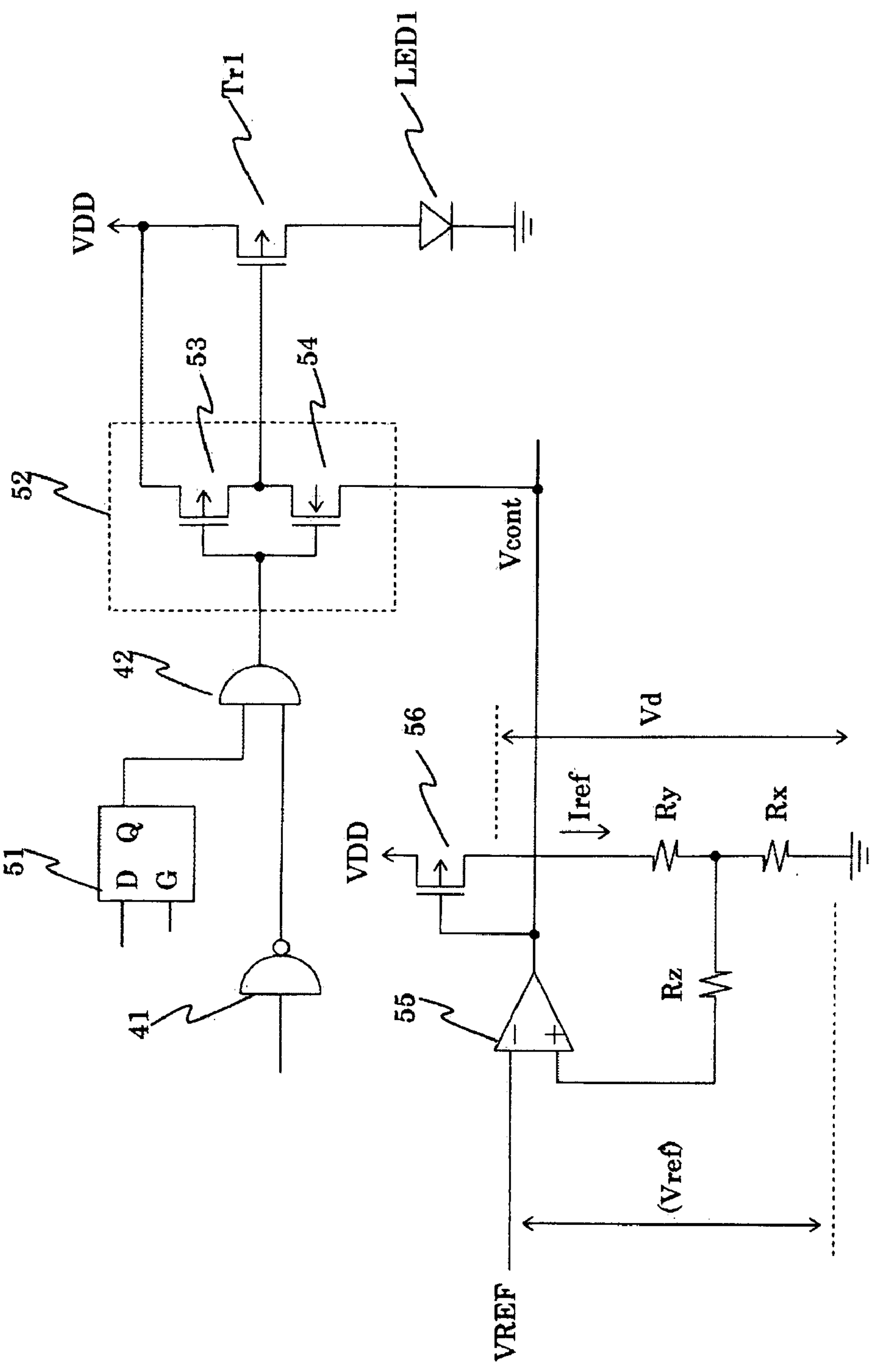
FIG. 21 CONVENTIONAL ART
FIG. 21 is a simplified circuit diagram showing the control voltage generation circuit of the conventional electro-photography printer.

The PMOS transistors 390 to 394 shown in FIG. 14 correspond to the drive transistor Tr1 of the conventional control voltage generation circuit shown in FIG. 21. The drive current output terminal DO is connected to the anode terminal of the LED element (not shown in FIG. 14), and the cathode of the LED element is connected to ground.

In the embodiment, gate terminals of the PMOS transistors 390 to 393 are connected to output terminals of the NAND circuits 380 to 383, respectively. The source terminals of the PMOS transistors 390 to 394 are connected to the power source VDD. Drain terminals of the PMOS transistors 390 to 394 are connected to the drive current output terminal DO.

In the embodiment, the PMOS transistors 390 to 394 shown in FIG. 14 have a same gate length. The PMOS transistors 390 to 393 have gate widths in a ratio of 1:2:4:8, corresponding to bit weights of correction data outputs from the correction data output terminals Q0 to Q3 of the memory circuit 300.

An operation of the NAND circuits 380 to 383 and the likes will be explained next. First, data are shift-input to the shift registers FFA1 to FFD48 and the likes shown in FIG. 11 to turn on the print data. Then, the LOAD-P signal is generated, and the print data are latched to the latch circuits LTA1 to LTD48 and the likes. When the print dots are turned on at this moment, an input level of the terminal E of the corresponding LED drive circuit 370 becomes High.

In FIG. 14, when the on-off direction signal S of the LED drive becomes Low for directing a drive-on, an output of the NOR circuit 386 becomes High. At this moment, according to the terminal data of Q0 to Q3, output signals of the NAND circuits 380 to 383 and an output of the inverter formed of the PMOS transistor 384 and the NMOS transistor 385 become the Vcont potential or the VDD potential.

In the embodiment, the PMOS transistor 344 is a main drive transistor for supplying a main drive current to the LED element. The PMOS transistors 390 to 393 are auxiliary drive transistors for adjusting the drive current of the LED element to correct a light amount.

When the output of the NOR circuit 386 is at the High level, the main drive transistor 394 is driven according to the print data. When the output of the NOR circuit 386 is at the High level, the auxiliary drive transistors 390 to 393 are driven according to the outputs of Q0 to Q3 from the memory circuit 300.

The memory circuit 300 stores the correction data (described later) for correcting a variance in light emitting from the LED element. The outputs of Q0 to Q3 correspond to the correction data per LED dot. The outputs of Q0 to Q3 are four bits, so that the correction data per LED dot are also four bits. Accordingly, it is possible to adjust the drive current at 16 stages per LED dot.

More specifically, the auxiliary drive transistors 390 to 393 are selectively driven together with the main drive transistor 394 according to the correction data. Accordingly, a drain current of the main drive transistor 394 is added to a drain current of the selected auxiliary drive transistor to obtain the drive current, and the drive current flows into the cathode of the LED element LED1 through the terminal DO.

When the PMOS transistors 390 to 393 are driven, the output of the inverter circuit formed of the NAND circuits 380 to 383, the PMOS transistor 384, and the NMOS transistor 385 becomes the Low level (that is, the level is the potential of the terminal V, and is equal to the control voltage Vcont). Accordingly, the gate potential of the PMOS transistors 390 to 394 becomes substantially equal to the control voltage Vcont. As a result, it is possible to collectively adjust the drain current value of the PMOS transistor 390 to 394 according to the control voltage Vcont per driver IC.

An operation of the second embodiment will be explained. First, an operation of the control voltage generation circuit 302 shown in FIG. 11 will be explained. When the signals SN0 to SN3 to be transmitted to the control voltage generation circuit 302 shown in FIG. 11 change in 16 stages, the control voltage generation circuit 302 operates as follows.

In FIG. 13, when the PMOS transistors 320 to 323 have the gate width of w0 to w3, respectively, and the NMOS transistor 313 has the gate width of wm, the following relationships are established:

$$w1=2\times w0$$

$$w2=4\times w0$$

$$w3=8\times w0$$

As well known in the art, the drain current Id of the MOS transistor operating in the saturated region is given by:

$$Id=K\times(W/L)\times(Vgs-Vt)^2$$

where K is the constant, W is the gate width, Vgs is the voltage between the gate and the source, and Vt is the threshold voltage.

As described above, the PMOS transistors 320 to 323, 313, and 362 have the same gate length. When each of the PMOS transistors 320 to 323, 313, and 362 is turned on, the PMOS transistors 320 to 323, 313, and 362 have the same voltage between the gate and the source thereof. Accordingly, the drain current of each of the PMOS transistors 320 to 323, 313, and 362 is proportional to the gate width of each of the PMOS transistors 320 to 323, 313, and 362.

When the PMOS transistors 320 to 323 are turned on, the drain currents Id0 to Id3 of the PMOS transistors 320 to 323 have the following relationships:

$$Id1=2\times Id0$$

$$Id2=4\times Id0$$

$$Id3=8\times Id0$$

It is assumed that the current Iref flows through the PMOS transistor 361, and the current Iref2 flows through the NMOS transistor 362.

When the signals SN0 to SN3 shown in FIG. 13 are '1111' of the negative logic, the PMOS transistors 340 to 343 are turned off, and the NMOS transistors 350 to 353 are turned on. Accordingly, the NMOS transistors 320 to 323 have the gate potential substantially equal to ground, and the NMOS transistors 320 to 323 are turned off.

The NMOS transistor 313 has the gate connected to the drain, so that the NMOS transistor 313 operates in the saturated region. Further, the NMOS transistor 362 has the gate potential equal to that of the NMOS transistor 313. Accordingly, it is assumed that the NMOS transistor 362 operates in the saturated region as well. In this case, a current flowing into the drain terminal of the NMOS transistor 313 is equal to the drain current of the PMOS transistor 312.

In the embodiment, the PMOS transistor 360 has the current mirror relationship with and the PMOS transistor 361. The drain current of the NMOS transistor 362 is equal to the drain current Iref2 of the PMOS transistor 360. When the PMOS transistor 360 and the PMOS transistor 361 have the same gate width, the drain current Iref of the PMOS transistor 361 is substantially equal to the drain current Iref2 of the PMOS transistor 360 (Iref=Iref2).

When the NMOS transistor 313 has the drain current Idm, a current Iref3 flowing through the PMOS transistor 312 is given by:

$$Iref3=Idm$$

In the embodiment, the calculation amplifier 311 controls the potential of the output terminal thereof such that the potential of the non-inversion input terminal thereof becomes equal to the potential of the inversion input terminal thereof.

Accordingly, the potential of the resistor 313 (resistivity of Rref) is equal to the VREF potential, and the current Iref of the PMOS transistor 361 is given by:

$$Iref=VREF/Rref$$

When the signals SN0 to SN3 shown in FIG. 13 are '1000' of the negative logic, the PMOS transistor 343 is turned off; the NMOS transistor 353 is turned on; the PMOS transistors 340 to 342 are turned on; and the NMOS transistors 350 to 352 are turned off. Accordingly, the NMOS transistor 323 has the gate potential substantially equal to the ground potential, and the NMOS transistors 320 to 323 have the gate potential substantially equal to the gate potential of the NMOS transistor 313.

Accordingly, the NMOS transistors 320 to 322 operates in the saturated region, and the drain currents thereof are generated at the current ratio of 1:2:4. At this time, the current Iref3 flowing out from the PMOS transistor 312 is equal to a sum of the drain current of the NMOS transistor 313 and the drain currents of the NMOS transistors 320 to 322. Accordingly, the current Iref3 is given by:

$$Iref3=Idm+(4+2+1)\times Id0=Idm+7\times Id0$$

At this moment, the current Iref of the PMOS transistor 361 is given by:

$$Iref=VREF/Rref$$

Accordingly, when the NMOS transistors 313 and 320 have the gate widths such that the current Iref3 flowing into the PMOS transistor 313 becomes equal to the current Iref, it is possible to set the target current value at the center of the chip correction.

When the signals SN0 to SN3 shown in FIG. 13 are '0000' of the negative logic, the PMOS transistors 340 to 343 are turned on, and the NMOS transistors 350 to 353 are turned off. Accordingly, the NMOS transistors 320 to 323 have the gate potential substantially equal to the gate potential of the NMOS transistor 313. As a result, the NMOS transistors 320 to 323 operate in the saturated region, and the drain currents thereof are generated at the current ratio of 1:2:4:8.

At this time, the current Iref3 flowing out from the PMOS transistor 312 is equal to a sum of the drain current of the NMOS transistor 313 and the drain currents of the NMOS transistors 320 to 323. Accordingly, the current Iref3 is given by:

$$Iref3=Idm+(8+4+2+1)\times Id0=Idm+15\times Id0$$

The current Iref3 of the PMOS transistor 312 in an actual case will be explained according to specific values of the standard voltage VREF and the standard current Iref. The values in the following description are just examples, and may not be values for actual design.

It is assumed that the standard voltage VREF is 1.5 V, and the standard current Iref is 1.0 mA. The PMOS transistor 360 and 361 have the same gate width, the current Iref is set equal to the current Iref2 (Iref=Iref2).

Further, the drain current Iref3 of the PMOS transistor 312 is 1.0 mA at the correction center shown in FIG. 20, and the current adjustment step is 3% according to the correction data.

In this case, the standard resistance Rref is given by:

$$Rref=Vref/Iref=1.5\text{ (V)}/1\text{ (mA)}=1.5\text{ K}\Omega$$

It is configured that the sum of the gate widths of the NMOS transistors 313, and 320 to 322 is 100 μm at the correction center, and the gate width of the NMOS transistor 362 is 100 μm. Further, the gate width W0 of the NMOS transistor 320 is 3 μm according to the correction adjustment step of 3%. Accordingly, the gate width of each of the transistors is given by:

$$w1=2\times w0=6\ \mu m$$

$$w2=4\times w0=12\ \mu m$$

$$w3=8\times w0=24\ \mu m$$

Further, the gate width wm of the NMOS transistor 313 is given by:

$$wm=100-(12+6+3)=79\ \mu m$$

As apparent from the calculations described above, in the state that the chip correction data are set at the minimum, the drain current Iref3 of the PMOS transistor 312 is given by:

$$Iref3=wm/100\times Iref2=0.79\text{ mA}$$

Accordingly, it is possible to obtain the low current value as the target value relative to the correction center point (−3%×7=−21%).

Further, in the state that the chip correction data are set at the maximum, the drain current Iref3 of the PMOS transistor 312 is given by:

$$Iref3=((wm+w3+w2+w1+w0)/100)\times Iref2=((79+24+12+6+3)/100)\times 1\text{ mA}=1.24\text{ mA}$$

Accordingly, it is possible to obtain the high current value as the target value relative to the correction center point (+3%×8=+24%).

As described above, with the control voltage generation circuit 302 shown in FIG. 13, it is possible to change the drain current of the PMOS transistor 312 at 16 stages through the combination of the logic values of the signals SN0 to SN3 input to the control voltage generation circuit 302.

Figure 15:
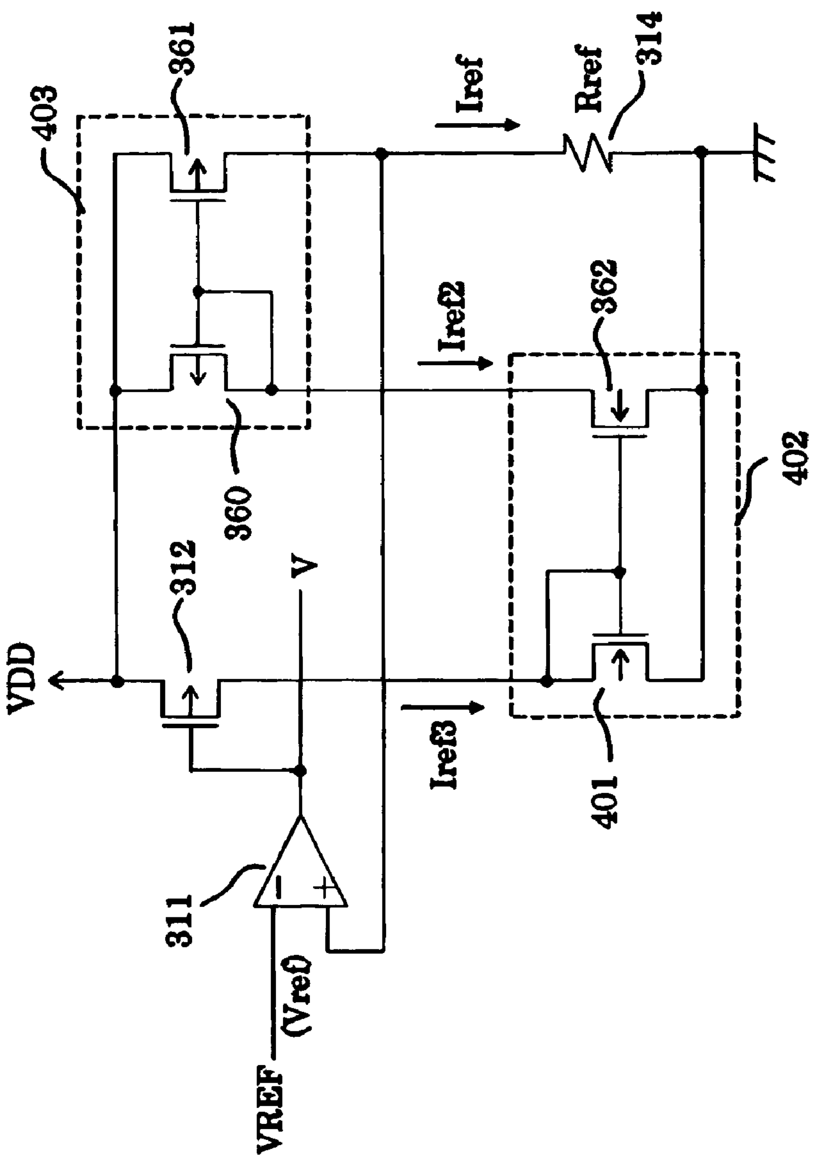
FIG. 15 is a simplified circuit diagram showing the control voltage generation circuit according to the second embodiment of the present invention.

An operation of the control voltage generation circuit 302 shown in FIG. 13 will be explained next. FIG. 15 is a simplified circuit diagram showing the control voltage generation circuit 302 according to the second embodiment of the present invention. Components shown in FIG. 15 corresponding to those in FIG. 13 are designated with the same reference numerals.

As shown in FIG. 15, an NMOS transistor 401 is a combined depiction of the NMOS transistors 313, 320 to 323 shown in FIG. 13. The drain currents Iref, Iref2, and Iref3 of the PMOS transistors 361, 360, and 312 are shown in FIG. 15.

It is assumed that the chip correction data SN0 to SN3 are '1111' in the correction data minimum state in the table shown in FIG. 20. In this case, the NMOS transistors 320 to 323 are turned off, and the NMOS transistor 313 is turned on.

Accordingly, the NMOS transistor 401 shown in FIG. 14 has the gate width same as the gate width wm of the NMOS transistor 313 shown in FIG. 13.

Further, it is assumed that the chip correction data SN0 to SN3 are '1000' in the correction data center state in the table shown in FIG. 20. In this case, the NMOS transistor 323 shown in FIG. 13 is turned off, the NMOS transistors 320 to 322 shown in FIG. 3 are turned on, and the NMOS transistor 313 shown in FIG. 3 is turned on. Accordingly, the NMOS transistor 401 shown in FIG. 15 has the gate width calculated from the gate width wm of the NMOS transistor 313 and the gate width w0 of the NMOS transistor 320 shown in FIG. 13 as follows:

$$wm=(4+2+1)\times w0$$

Further, it is assumed that the chip correction data SN0 to SN3 are '0000' in the correction data maximum state in the table shown in FIG. 20. In this case, the NMOS transistors

320 to 323 shown in FIG. 13 are turned on, and the NMOS transistor 313 shown in FIG. 13 is turned on. Accordingly, the NMOS transistor 401 shown in FIG. 15 has the gate width calculated from the gate width wm of the NMOS transistor 313 and the gate width w0 of the NMOS transistor 320 shown in FIG. 13 as follows:

$$wm=(8+4+2+1)\times w0$$

When the gate width of the NMOS transistor 401 is equal to the gate width of the NMOS transistor 362, and the correction data are set at the center, the current Iref3 is equal to the current Iref2 (Iref3=Iref2). At this time, the voltage between the gate and the source of the PMOS transistor 312 is output as the potential Vcont to the LED drive circuit 370 shown in FIG. 14. Further, the PMOS transistor 390 to 394 shown in FIG. 14 in the current mirror relationship with the PMOS transistor 312 generate a current value proportional to the drain current Iref3, thereby driving the LED element (not shown).

When the correction data are set at the minimum, the gate width of the NMOS transistor 401 becomes smaller than the gate width of the NMOS transistor 362 by −21%. Accordingly, the current Iref3 is given by:

$$Iref3=Iref2\times(1-0.21)=0.79\times Iref2$$

Accordingly, the PMOS transistor 390 to 394 shown in FIG. 14 generate a current value proportional to the current Iref3, thereby driving the LED element (not shown).

When the correction data are set at the maximum, the gate width of the NMOS transistor 401 becomes greater than the gate width of the NMOS transistor 362 by +24%. Accordingly, the drain current Iref3 is given by:

$$Iref3=Iref2\times(1+0.24)=1.24\times Iref2$$

Accordingly, the PMOS transistor 390 to 394 shown in FIG. 14 generate a current value proportional to the drain current Iref3, thereby driving the LED element (not shown).

In the embodiment, it is possible to normally operate the drive circuit even when the power source voltage is 3.3 V for the following reasons. In FIG. 15, it is assumed that the voltage between the gate and the source Vgs of the NMOS transistor 401 is 2 V (Vgs=2 V) even when the chip correction rate is set maximum. At the time, the voltage between the drain and the source Vds of the PMOS transistor 312 is given by:

$$Vds=VDD-Vgs$$

In order for the PMOS transistor 312 to operate in the saturated region, it is necessary to establish the following equation:

$$Vds\geqq Vgs-Vt$$

where Vt is the threshold voltage of the PMOS transistor.

As an actual example, when the voltage between the drain and the source Vds is 2 V (Vds=2 V), the threshold voltage Vt is 0.7 V (Vt=0.7 V), and the power source voltage is 5 V (VDD=5 V), the voltage between the drain and the source Vds becomes greater than Vgs−Vt as follows:

$$Vgs-Vt=2.0-0.7=1.3\text{ (V)}$$

Accordingly, the PMOS transistor 312 operates in the saturated region.

Similarly, when the power source voltage is 3.3 V (VDD=3.3 V), the voltage between the drain and the source Vds is given by:

$$Vds=VDD-Vgs=3.3-2=1.3\text{ (V)}$$

Accordingly, the voltage between the drain and the source Vds becomes equal to Vgs−Vt as follows:

$$Vgs-Vt=2.0-0.7=1.3\text{ (V)}$$

Accordingly, when the power source voltage is 3.3 V, the PMOS transistor 312 operates in the saturated region, so that the circuit shown in FIG. 15 operates normally.

As described above, in the embodiment, the drive circuit provides the following effects. With the recent advancement in the semiconductor manufacturing process technology, a size of an MOS transistor has been drastically reduced. As a result, a withstand voltage of the MOS transistor tends to decrease, thereby making it necessary to decrease a power voltage of an IC including the MOS transistor.

For example, a conventional standard power voltage of 5 V has decreased to 3.3 V to 2.5 V. As apparent from the trend, it is necessary to decrease the power voltage with decreasing the size of the MOS transistor.

In the conventional technology, when the power voltage is 5 V, the circuit can be operated normally. However, when the power voltage is 3.3 V, it is difficult to operate the circuit. It has been required to provide a circuit capable of operating at the power voltage of 3.3 V, lower than the conventional standard power voltage.

In the embodiment, it is possible to operate the circuit even when the power voltage is 3.3 V. Accordingly, it is possible to produce the driver IC using a CMOS manufacturing process with a reduced size, thereby reducing a size of the chip.

Further, in the LED head of the embodiment, it is possible to reduce power consumption of the river IC through reducing the power voltage. Accordingly, it is possible to prevent a problem in which a dot position of each LED head due to thermal expansion caused by heat of the LED head and a temperature increase associated therewith, thereby obtaining synergy effect.

Further, in the embodiment, as opposed to the conventional configuration in which 16 resistor elements (R0 to R16 shown in FIG. 19) are arranged, one resistor 314 is disposed as shown in FIG. 13. Accordingly, it is possible to reduce the chip area occupied by the resistor element, thereby reducing manufacturing cost.

Third Embodiment

Figure 17:
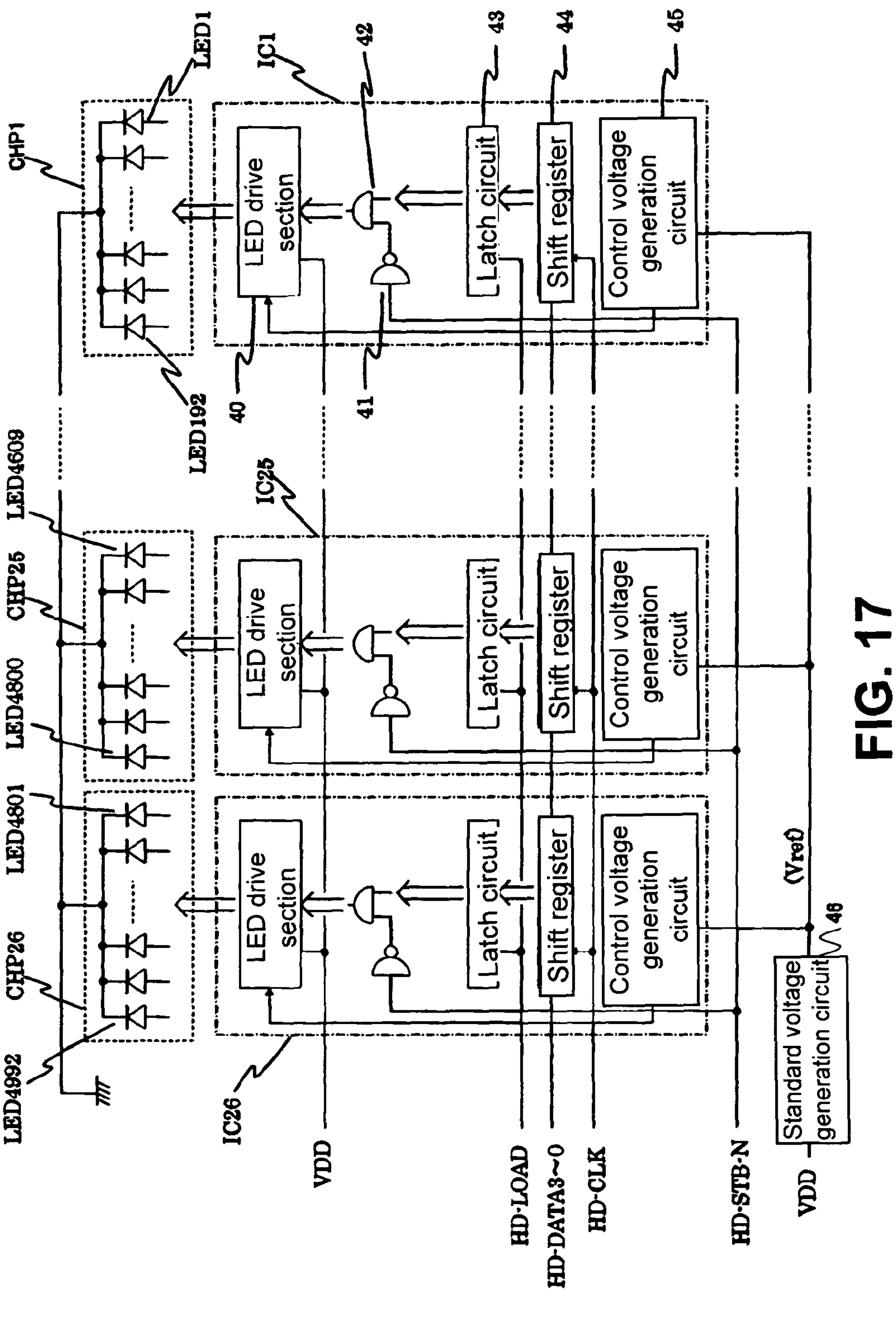
FIG. 17 CONVENTIONAL ART
FIG. 17 is a block diagram showing a configuration of an LED head of the conventional electro-photography printer.
Figure 24:
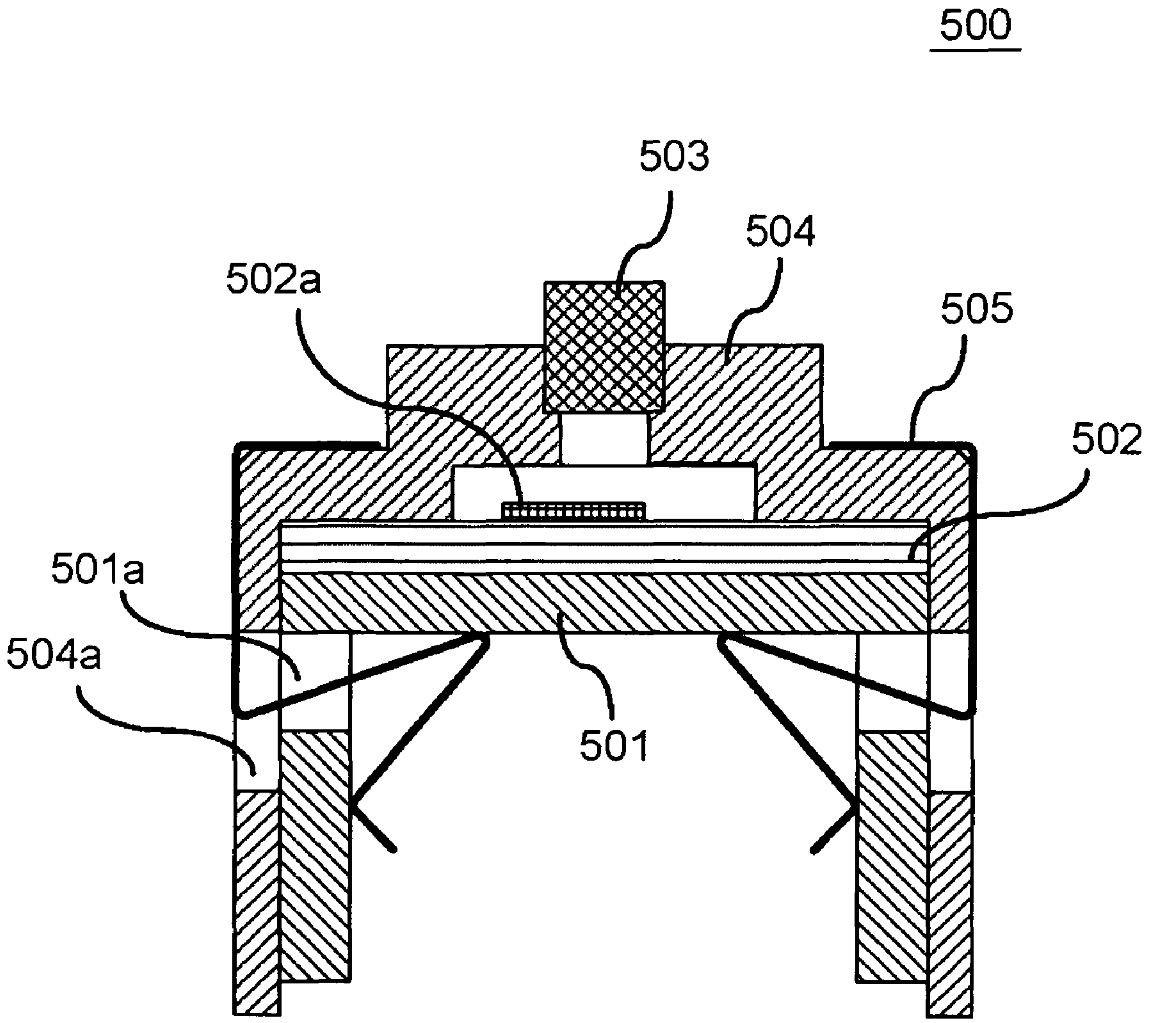
FIG. 24 is a schematic view showing an LED head according to a third embodiment of the present invention.

A third embodiment of the present invention will be explained next. FIG. 24 is a schematic view showing an LED head 500 according to the third embodiment of the present invention. As shown in FIG. 24, an LED unit 502 is mounted on a base member 501. In the LED unit 502, the circuits shown in FIG. 17 and the likes are mounted on a mounting board.

Figure 25:
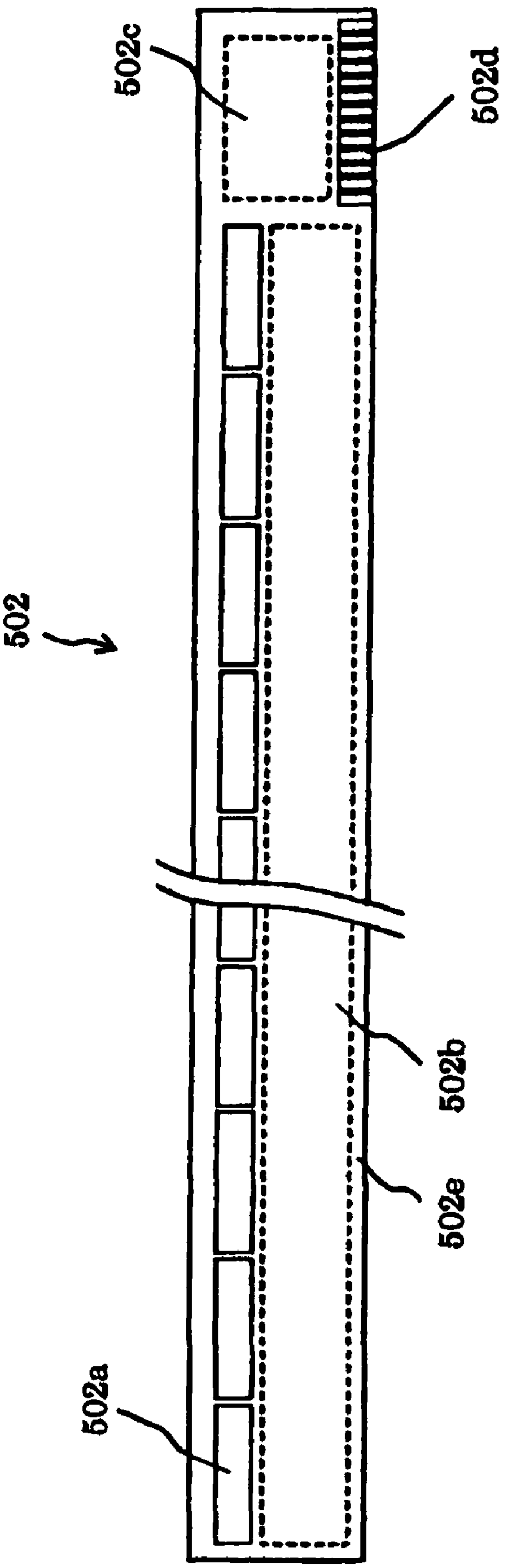
FIG. 25 is a schematic plan view showing an LED unit according to the third embodiment of the present invention.

FIG. 25 is a schematic plan view showing the LED unit 502 according to the third embodiment of the present invention. As shown in FIG. 25, in the LED unit 502, a plurality of circuits 502*a* formed of the light emitting portions (CHP1 to CHP26) and the drive circuits (IC1 to IC26) described above is arranged on a mounting substrate 502*e* along a longitudinal direction thereof. On the mounting substrate 502*e*, there are disposed electrical device mounting areas 502*b* and 502*c* for mounting electrical devices and wiring patterns, and a connector 502*d* for supplying a control signal and power from outside.

Figure 23:
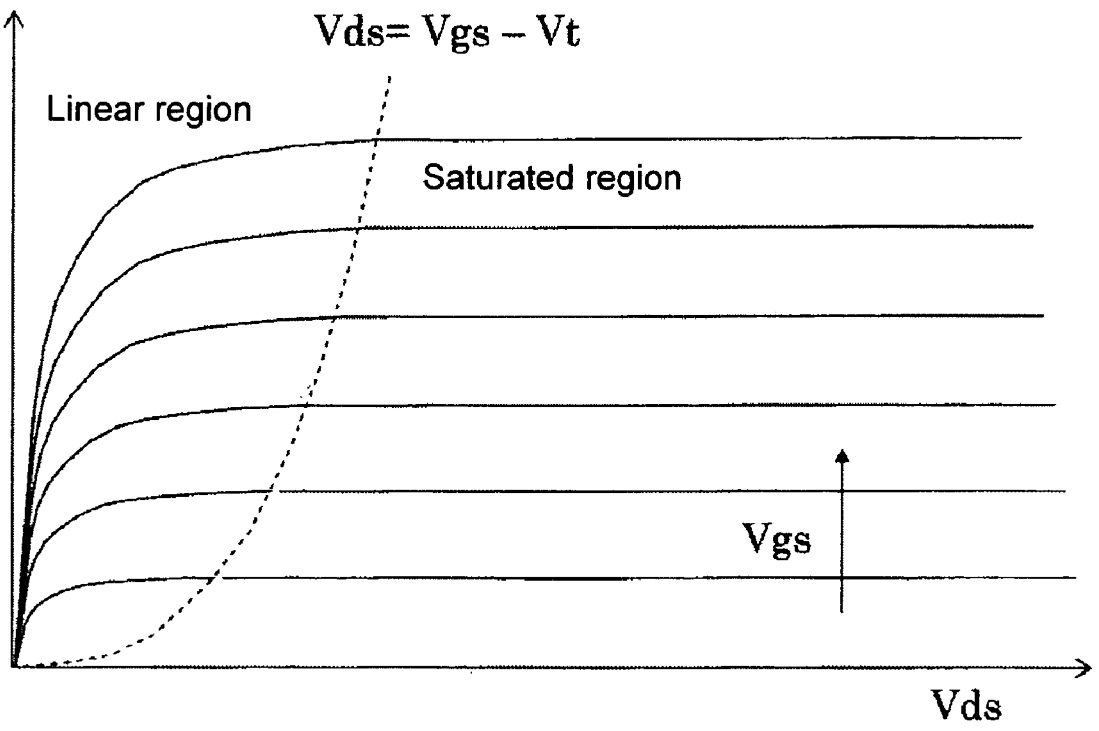
FIG. 23 CONVENTIONAL ART
FIG. 23 is a graph showing static characteristics of a PMOS transistor shown in FIG. 21.

As shown in FIG. 23, a rod lens array 503 is disposed on the light emitting portions of the LED array (CHP1 to CHP26) as an optical element for collecting light emitting from the light emitting portions. In the rod lens array 503, a plurality of optical lenses with a column shape is arranged along the light emitting portions 202*a* of the light emitting units 502*a* arranged linearly (the arrangement of CHP1 to CHP26 shown in FIG. 1). A lens holder 504 as an optical element holder holds the rod lens array 503 at a specific position.

As shown in FIG. 24, the lens holder 504 covers the base member 501 and the LED unit 502. A clamper 505 is arranged through opening portions 501*a* and 504*a* formed in the base member 501 and the lens holder 504, so that the damper 505 integrally holds the base member 501, the LED unit 502, and the lens holder 504. Accordingly, light emitting from the LED unit 502 irradiates a specific outer member through the rod lens array 503. The LED print head 500 is used as an exposure device of an electro-photography printer, an electro-photography copier, and the likes.

Figure 26:
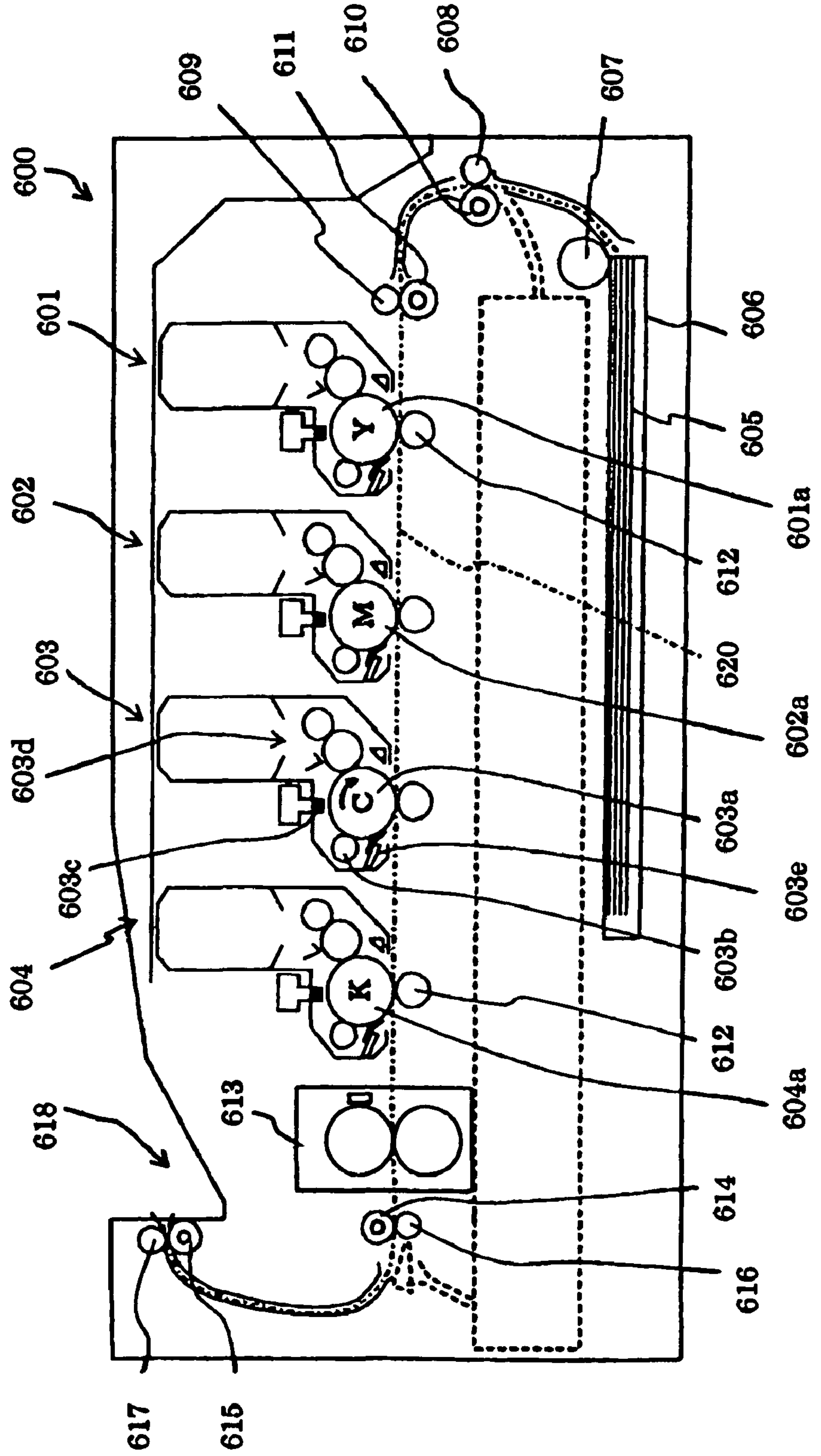
FIG. 26 is a schematic view showing an image forming apparatus according to the third embodiment of the present invention.

FIG. 26 is a schematic view showing an image forming apparatus 600 according to the third embodiment of the present invention.

As shown in FIG. 26, in the image forming apparatus 600, four process units 601 to 604 are arranged in this order from an upstream side along a transport path 620 of a recoding medium 605 for forming images in yellow, magenta, cyan, and black, respectively. The process units 601 to 604 have an identical internal configuration, and the process unit 603 for forming an image in cyan will be explained as an example.

In the process unit 603, a photosensitive drum 603*a* as an image supporting member is disposed to be rotatable in an arrow direction. Around the photosensitive drum 603*a* from an upstream side with respect to rotation of the photosensitive drum 603*a*, there are arranged a charging device 603*b* for applying a voltage and charging a surface of the photosensitive drum 603*a*; and an exposure device 603*c* for selectively irradiating light on the surface of the photosensitive drum 603*a* thus charged to form a static latent image thereon. The exposure device 603*c* corresponds to the LED print head 500 shown in FIG. 24.

Further, there are arranged a developing device 603*d* for attaching toner of a specific color (cyan) to the surface of the photosensitive drum 603*a* with the latent image formed thereon to visualize (develop) the static latent image; and a cleaning device 603*e* for removing toner remaining on the surface of the photosensitive drum 603*a*. Note that the photosensitive drum 603*a*, the charging device 603*b*, the exposure device 603*c*, the developing device 603*d*, and the cleaning device 603*e* are driven with a drive source and a gear (not shown).

In the embodiment, the image forming apparatus 600 is provided with a sheet cassette 606 at a lower portion thereof for storing the recording medium 605 in a stacked state, and a hopping roller 607 above the sheet cassette 607 for separating and transporting the recording medium 605 one by one. On a downstream side of the hopping roller 607 in a direction that the recording medium 605 is transported, pinch rollers 608 and 609 and register rollers 610 and 611 are disposed for sandwiching the recording medium 605 to correct skew of the recording medium 605 and transporting the recording medium 605 to the process units 601 to 604. Note that the hopping roller 607 and the register rollers 610 and 611 are driven with a drive source and a gear (not shown).

In the process units 601 to 604, transfer rollers 612 formed of a semi-conductive rubber and the likes are disposed at positions facing the photosensitive drums 601*a* to 604*a*. It is arranged such that a specific potential is generated between the surfaces of the photosensitive drums 601*a* to 604*a* and the transfer rollers 612, so that toner on the photosensitive drums 601*a* to 604*a* is attached to the recording medium 605.

In the embodiment, a fixing device 613 includes a heating roller and a back-up roller, so that toner transferred to the recording medium 605 is heated and pressed for fixing. Discharge roller 614 and 615 sandwich the recording medium 605 discharged from the fixing device 613 with pinch rollers 616 and 617, so that the recording medium 605 is transported to a recording medium stacker portion 618. Note that the discharge roller 614 and 615 are driven with a drive source and a gear (not shown).

An operation of the image forming apparatus 600 will be explained next. First, the hopping roller 607 separates and transports the recording medium 605 stored in the sheet cassette 606 in a stacked state. The register rollers 610 and 611 and the pinch rollers 608 and 609 sandwich the recording medium 615, thereby transporting the recording medium 615 to the photosensitive drum 601*a* and the transfer roller 612. Then, the photosensitive drum 601*a* and the transfer roller 612 sandwich the recording medium 605 to transfer a toner image to the recording medium 605, while the photosensitive drum 601*a* rotates to transport the recording medium 605.

Similar to the process described above, the recording medium 605 sequentially passes through the process units 602 to 604. Accordingly, the developing devices 601*d* to 604*d* develop the latent images formed with the exposure devices 601*c* to 604*c* to form the toner images in colors, and the toner images are sequentially transferred and overlapped on the recording medium 605.

After the toner images are overlapped on the recording medium 605, the fixing device 613 fixes the toner images. Afterward, the discharge rollers 614 and 615 and the pinch rollers 616 and 617 sandwich the recording medium 605 to discharge to the recording medium stacker portion 618 outside the image forming apparatus 600. Through the process described above, a color image is formed on the recording medium 605.

In the embodiments described above, the drive circuit is applied to the electro-photography printer using the LEDs as the light source, and may be applicable to a self-scanning type LED head using a light emitting thyristor as a light source, an organic EL head using an organic EL elements as a light source, and the likes. Further, the drive circuit may be applicable for driving a heating resistor member in a thermal printer, a row of display elements in a display device, and a surface light emitting element row.

The disclosure of Japanese Patent Application No. 2007-135891, filed on May 22, 2007, is incorporated in the application by reference.

While the invention has been explained with reference to the specific embodiments of the invention, the explanation is illustrative and the invention is limited only by the appended claims.

What is claimed is:

1. A drive circuit for driving a driven element, comprising:
a drive element for driving the driven element;
a correction data input section for adjusting a drive current of the driven element;
a resistor having a first end portion and a second end portion, said second end portion being connected to ground; and
a control voltage generation section for generating a direction value of the drive current of the driven element according to correction data input from the correction data input section,
wherein said control voltage generation section includes,
a calculation amplifier having a first input terminal for receiving a standard voltage, a second input terminal, and an output terminal;

a first conductive type transistor having a first terminal, a second terminal, and a control terminal, said second terminal being connected to the ground, said control terminal being connected to the output terminal; and a current-mirror circuit, said current-mirror including at least two second conductive type transistors, one of said two second conductive type transistors being a control side transistor, the other of said two second conductive type transistors being a follower side transistor, said control side transistor having a first current output terminal connected to the first terminal, said follower side transistor having a second current output terminal connected to the first end portion and the second input terminal.

2. The drive circuit according to claim 1, wherein said control side transistor includes a plurality of transistors, each of said transistors being controlled to turn on and off according to the correction data.

3. An LED (Light Emitting Diode) head comprising the drive circuit according to claim 1.

4. An image forming apparatus comprising the drive circuit according to claim 1.

5. A drive circuit for adjusting a drive current of a driven element, comprising:

a resistor having a first end portion and a second end portion, said second end portion being connected to ground; a calculation amplifier having a first input terminal for receiving a standard voltage, a second input terminal, and an output terminal;

a first conductive type transistor having a first terminal, a second terminal, and a control terminal, said second terminal being connected to the ground, said control terminal being connected to the output terminal; and a current-mirror circuit, said current-mirror including at least two second conductive type transistors, one of said two second conductive type transistors being a control side transistor, the other of said two second conductive type transistors being a follower side transistor, said control side transistor having a first current output terminal connected to the first terminal, said follower side transistor having a second current output terminal connected to the first end portion and the second input terminal.

6. An LED (Light Emitting Diode) head comprising the drive circuit according to claim 5.

7. An image forming apparatus comprising the drive circuit according to claim 5.

8. A drive circuit for driving a driven element, comprising:

a drive element for driving the driven element;

a correction data input section for adjusting a drive current of the driven element;

a resistor having a first end portion and a second end portion, said second end portion being connected to ground; and a control voltage generation section for generating a direction value of the drive current of the driven element according to correction data input from the correction data input section, wherein said control voltage generation section includes, a calculation amplifier having a first input terminal for receiving a standard voltage, a second input terminal connected to the first end portion, and an output terminal;

a transistor having a first terminal and a control terminal, said control terminal being connected to the output terminal;

a first current-mirror circuit, said first current-mirror including at least two first conductive type transistors, one of said two first conductive type transistors being a first control side transistor, the other of said two first conductive type transistors being a first follower side transistor, said first control side transistor having a first current output terminal connected to the first terminal, said first follower side transistor having a second current output terminal; and a second current-mirror circuit, said second current-mirror including at least two second conductive type transistors, one of said two second conductive type transistors being a second control side transistor, the other of said two second conductive type transistors being a second follower side transistor, said second control side transistor having a third current output terminal connected to the second current output terminal, said second follower side transistor having a fourth current output terminal connected to the second input terminal.

9. An LED (Light Emitting Diode) head comprising the drive circuit according to claim 8.

10. The drive circuit according to claim 8, wherein said control side transistor includes a plurality of transistors, each of said transistors being controlled to turn on and off according to the correction data.

11. An image forming apparatus comprising the drive circuit according to claim 8.

12. A drive circuit for adjusting a drive current of a driven element;

a resistor having a first end portion and a second end portion, said second end portion being connected to ground; and a calculation amplifier having a first input terminal for receiving a standard voltage, a second input terminal connected to the first end portion, and an output terminal;

a transistor having a first terminal and a control terminal, said control terminal being connected to the output terminal;

a first current-mirror circuit, said first current-mirror including at least two first conductive type transistors, one of said two first conductive type transistors being a first control side transistor, the other of said two first conductive type transistors being a first follower side transistor, said first control side transistor having a first current output terminal connected to the first terminal, said first follower side transistor having a second current output terminal; and a second current-mirror circuit, said second current-mirror including at least two second conductive type transistors, one of said two second conductive type transistors being a second control side transistor, the other of said two second conductive type transistors being a second follower side transistor, said second control side transistor having a third current output terminal connected to the second current output terminal, said second follower side transistor having a fourth current output terminal connected to the second input terminal.

13. An LED (Light Emitting Diode) head comprising the drive circuit according to claim 12.

14. An image forming apparatus comprising the drive circuit according to claim 12.

* * * * *